(12) United States Patent
Plummer et al.

(10) Patent No.: US 10,435,814 B2
(45) Date of Patent: Oct. 8, 2019

(54) SINGLE METAL CRYSTALS

(71) Applicant: The Board of Trustees of the Leland Stanford Junior University, Stanford, CA (US)

(72) Inventors: James D. Plummer, Portola Valley, CA (US); Kai Zhang, Stanford, CA (US); Xue Bai Pitner, Stanford, CA (US); Jonathan A. Fan, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 247 days.

(21) Appl. No.: 15/339,466

(22) Filed: Oct. 31, 2016

(65) Prior Publication Data

US 2017/0121843 A1 May 4, 2017

Related U.S. Application Data

(60) Provisional application No. 62/248,921, filed on Oct. 30, 2015.

(51) Int. Cl.
| | | |
|---|---|---|
| *C30B 11/00* | (2006.01) | |
| *C30B 29/02* | (2006.01) | |
| *C30B 11/14* | (2006.01) | |
| *C30B 29/52* | (2006.01) | |
| *C30B 29/60* | (2006.01) | |

(52) U.S. Cl.
CPC .............. *C30B 29/02* (2013.01); *C30B 11/00* (2013.01); *C30B 11/002* (2013.01); *C30B 11/14* (2013.01); *C30B 29/52* (2013.01); *C30B 29/60* (2013.01)

(58) Field of Classification Search
CPC ......... C30B 11/00; C30B 29/52; C30B 11/14; C30B 11/002
See application file for complete search history.

(56) References Cited

U.S. PATENT DOCUMENTS

| | | |
|---|---|---|
| 4,381,202 A | 4/1983 | Mori et al. |
| 6,375,790 B1 * | 4/2002 | Fenner ................. H01J 37/317 |
| | | 118/723 CB |
| 6,635,110 B1 | 10/2003 | Luan et al. |
| 6,897,471 B1 | 5/2005 | Soref et al. |
| 6,946,318 B2 | 9/2005 | Wada et al. |
| 7,008,813 B1 | 3/2006 | Lee et al. |
| 7,498,243 B2 | 3/2009 | Liu et al. |
| 7,696,032 B2 | 4/2010 | Kim et al. |
| 7,785,944 B2 | 8/2010 | Zhu et al. |

(Continued)

OTHER PUBLICATIONS

Gao, Li, et al. "Optics and nonlinear buckling mechanics in large-area, highly stretchable arrays of plasmonic nanostructures." ACS nano 9.6 (2015): 5968-5975.

(Continued)

*Primary Examiner* — Matthew J Song
(74) *Attorney, Agent, or Firm* — Crawford Maunu PLLC

(57) ABSTRACT

A single-crystalline metal is created on a substrate by liquefying a metal material contained within a crucible while in contact with a surface of the substrate, cooling the metal material by causing a temperature gradient effected in the substrate in a direction that is neutral along the surface of the substrate and, therein, growing the single-crystalline metal in the crucible.

15 Claims, 31 Drawing Sheets

(56) References Cited

U.S. PATENT DOCUMENTS

| | | | |
|---|---|---|---|
| 8,198,704 | B2 | 6/2012 | Kim et al. |
| 8,232,516 | B2 | 7/2012 | Assefa et al. |
| 8,304,272 | B2 | 11/2012 | Assefa et al. |
| 8,841,162 | B2 | 9/2014 | Assefa et al. |
| 8,846,440 | B2 | 9/2014 | Assefa et al. |
| 8,940,149 | B2 | 1/2015 | Ahmed et al. |
| 9,006,048 | B2 | 4/2015 | Assefa et al. |
| 9,006,049 | B2 | 4/2015 | Assefa et al. |
| 2001/0012678 | A1 | 8/2001 | Tanak et al. |
| 2005/0205954 | A1 | 9/2005 | King et al. |
| 2006/0099773 | A1 | 5/2006 | Maa et al. |
| 2006/0194357 | A1 | 8/2006 | Hsu et al. |
| 2006/0194418 | A1 | 8/2006 | Lee et al. |
| 2007/0169857 | A1* | 7/2007 | Jeong ............ C30B 11/00 148/562 |
| 2008/0127885 | A1* | 6/2008 | Hagi ............. C30B 11/002 117/209 |
| 2009/0047203 | A1* | 2/2009 | Mueller .......... C30B 11/14 423/348 |
| 2009/0176353 | A1* | 7/2009 | Plummer ........ B82Y 10/00 438/481 |
| 2010/0058977 | A1* | 3/2010 | Schaadt ........... B22C 9/04 117/23 |
| 2011/0280273 | A1 | 11/2011 | Conway et al. |
| 2014/0305369 | A1* | 10/2014 | Sakai ............ C30B 19/02 117/64 |
| 2016/0208411 | A1* | 7/2016 | Shirai ............ C30B 9/10 |

OTHER PUBLICATIONS

Wu, Chihhui, et al. "Spectrally selective chiral silicon metasurfaces based on infrared Fano resonances." Nature 5.3892 (2014).
Masouleh, Farzaneh Fadakar, Narottam Das, and Hamid Reza Mashayekhi. "Comparison of different plasmonic nanograting profiles for quality light absorption in nanostructured metal-semiconductor-metal photodetectors." Optical Engineering 52.12 (2013): 127101-127101. Abstract only.
Turnbull, D. "Kinetics of heterogeneous nucleation." The Journal of Chemical Physics 18.2 (1950): 198-203. Abstract only.
Neighbours, J. R., F. W. Bratten, and Charles S. Smith. "The elastic constants of nickel." Journal of Applied Physics 23.4 (1952): 389-393. Abstract Only.
Palmberg, P. W., T. N. Rhodin, and C. J. Todd. "Epitaxial growth of gold and silver on magnesium oxide cleaved in ultrahigh vacuum." Applied Physics Letters 11.2 (1967): 33-35. Abstract Only.
Mayadas, A. F., and M. Shatzkes. "Electrical-resistivity model for polycrystalline films: the case of arbitrary reflection at external surfaces." Physical review B 1.4 (1970): 1382. Abstract only.
Anantatmula, R. P., et al. "The gold-silicon phase diagram." Journal of Electronic Materials 4.3 (1975): 445-463. Abstract only.
Wolf, R. "Electropolishing of gold and gold-rich alloys." Micron (1969) 8.3 (1977): 171-172. Abstract only.
Cho, A. Y., and P. D. Dernier. "Single-crystal-aluminum Schottky-barrier diodes prepared by molecular-beam epitaxy (MBE) on GaAs." Journal of Applied Physics 49.6 (1978): 3328-3332. Abstract only.
Geis, M. W., et al. "Zone-melting recrystallization of encapsulated silicon films on SiO2—morphology and crystallography." Applied Physics Letters 40.2 (1982): 158-160. Abstract only.
Okamoto, H., and T. B. Massalski. "The Au—Pt (Gold-Platinum) system." Bulletin of Alloy Phase Diagrams 6.1 (1985): 46-56. Description only.
Seidel, H., et al. "Anisotropic etching of crystalline silicon in alkaline solutions I. Orientation dependence and behavior of passivation layers." Journal of the electrochemical society 137.11 (1990): 3612-3626.
Smith, Arthur R., et al. "Formation of Atomically Flat Silver Films on GaAs with a"Silver Mean" Quasi Periodicity." Science 273.5272 (1996): 226-228. Abstract only.

Pierce, D. G., and P. G. Brusius. "Electromigration: A review." Microelectronics Reliability 37.7 (1997): 1053-1072. Abstract only.
Oyamatsu, Daisuke, et al. "Underpotential deposition of silver onto gold substrates covered with self-assembled monolayers of alkanethiols to induce intervention of the silver between the monolayer and the gold substrate." Langmuir 14.12 (1998): 3298-3302. Abstract only.
Giannuzzi, L. A., and F. A. Stevie. "A review of focused ion beam milling techniques for TEM specimen preparation." Micron 30.3 (1999): 197-204.
Thompson, C. V. "Structure evolution during processing of polycrystalline films." Annual review of materials science 30.1 (2000): 159-190. Abstract only.
Heinke, H., et al. "X-ray diffraction analysis of the defect structure in epitaxial GaN." Applied Physics Letters 77.14 (2000): 2145-2147. Abstract only.
Voisin, Christophe, et al. "Ultrafast electron dynamics and optical nonlinearities in metal nanoparticles." (2001): 2264-2280. Abstract only.
Jana, Nikhil R., Latha Gearheart, and Catherine J. Murphy. "Wet chemical synthesis of silver nanorods and nanowires of controllable aspect ratioElectronic supplementary information (ESI) available: UV—VIS spectra of silver nanorods. See http://www. rsc. org/suppdata/cc/b1/b100521i." Chemical Communications 7 (2001): 617-618. Abstract only.
Sun, Yugang, and Younan Xia. "Shape-controlled synthesis of gold and silver nanoparticles." Science 298.5601 (2002): 2176-2179.
Barnes, William L., Alain Dereux, and Thomas W. Ebbesen. "Surface plasmon subwavelength optics." Nature 424.6950 (2003): 824-830.
Yu, Dabin, and Vivian Wing-Wah Yam. "Controlled synthesis of monodisperse silver nanocubes in water." Journal of the American Chemical Society 126.41 (2004): 13200-13201. Abstract only.
Wu, Yue, et al. "Single-crystal metallic nanowires and metal/semiconductor nanowire heterostructures." Nature 430.6995 (2004): 61-65. Abstract only.
Borkowska, Z., A. Tymosiak-Zielinska, and G. Shul. "Electrooxidation of methanol on polycrystalline and single crystal gold electrodes." Electrochimica acta 49.8 (2004): 1209-1220.
Liu, Yaocheng, Michael D. Deal, and James D. Plummer. "High-quality single-crystal Ge on insulator by liquid-phase epitaxy on Si substrates." Applied Physics Letters 84.14 (2004): 2563-2565. Abstract only.
Pérez-Juste, Jorge, et al. "Gold nanorods: synthesis, characterization and applications." Coordination Chemistry Reviews 249.17 (2005): 1870-1901.
Ditlbacher, H., Hohenau, A., Wagner, D., Kreibig, U., Rogers, M., Hofer, F., . . . & Krenn, J. R. (2005). Silver nanowires as surface plasmon resonators. Physical review letters, 95(25), 257403.
Liu, Yaocheng, Michael D. Deal, and James D. Plummer. "Rapid melt growth of germanium crystals with self-aligned microcrucibles on Si substrates." Journal of the Electrochemical Society 152.8 (2005): G688-G693. Abstract only.
Sherry, Leif J., et al. "Localized surface plasmon resonance spectroscopy of single silver nanocubes." Nano letters 5.10 (2005): 2034-2038.
Liu, Zhaowei, et al. "Focusing surface plasmons with a plasmonic lens." Nano letters 5.9 (2005): 1726-1729.
Sergey I. Bozhevolnyi, et al., "Channel Plasmon-Polariton Guiding by Subwavelength Metal Grooves" Phys. Rev. Lett. 95, 046802 (2005).
Feng, Jia, et al. "Integration of germanium-on-insulator and silicon MOSFETs on a silicon substrate." IEEE Electron Device Letters 27.11 (2006): 911-913.
Cubukcu, Ertugrul, et al. "Plasmonic laser antenna." Applied Physics Letters 89.9 (2006): 093120.
Bozhevolnyi, Sergey I., et al. "Channel plasmon subwavelength waveguide components including interferometers and ring resonators." (2006).
Feng, Jia, et al. "P-channel germanium FinFET based on rapid melt growth." IEEE electron device letters 28.7 (2007): 637-639. Abstract only.

(56) References Cited

OTHER PUBLICATIONS

Righini, M., Zelenina, A. S., Girard, C. & Quidant, R. Parallel and selective trapping in a patterned plasmonic landscape. Nature Physics 3, 477-480 (2007).
A. V. Akimov, A. Mukherjee, C. L. Yu, D. E. Chang, A. S. Zibrov, P. R. Hemmer, H. Park, M. D. Lukin, Generation of single optical plasmons in metallic nanowires coupled to quantum dots. Nature 450, 402-406 (2007).
Awazu, Koichi, et al. "A plasmonic photocatalyst consisting of silver nanoparticles embedded in titanium dioxide." Journal of the American Chemical Society 130.5 (2008): 1676-1680.
Oulton, Rupert F., et al. "A hybrid plasmonic waveguide for subwavelength confinement and long-range propagation." Nature Photonics 2.8 (2008): 496-500.
Anker, Jeffrey N., et al. "Biosensing with plasmonic nanosensors." Nature Materials 7 (2008): 442-453.
Bryant, Garnett W., F. Javier García de Abajo, and Javier Aizpurua. "Mapping the plasmon resonances of metallic nanoantennas." Nano letters 8.2 (2008): 631-636.
Liu, Zhengtong, et al. "Plasmonic nanoantenna arrays for the visible." Metamaterials 2.1 (2008): 45-51.
Le, Fei, et al. "Metallic nanoparticle arrays: a common substrate for both surface-enhanced Raman scattering and surface-enhanced infrared absorption." ACS nano 2.4 (2008): 707-718.
Gansel, Justyna K., et al. "Gold helix photonic metamaterial as broadband circular polarizer." Science 325.5947 (2009): 1513-1515.
Smythe, Elizabeth J., et al. "Optical Antenna Arrays on a Fiber Facet for In Situ Surface Enhanced Raman Scattering Detection." Nano Lett 9.3 (2009): 1132-1138.
Cai, Wenshan, Justin S. White, and Mark L. Brongersma. "Compact, high-speed and power-efficient electrooptic plasmonic modulators." Nano letters 9.12 (2009): 4403-4411.
Chen, Weibin, et al. "Plasmonic lens made of multiple concentric metallic rings under radially polarized illumination." Nano letters 9.12 (2009): 4320-4325.
Falk, Abram L., et al. "Near-field electrical detection of optical plasmons and single-plasmon sources." Nature Physics 5.7 (2009): 475-479.
Oulton, Rupert F., et al. "Plasmon lasers at deep subwavelength scale." Nature 461.7264 (2009): 629-632.
Akbari, Ali, R. Niall Tait, and Pierre Berini. "Surface plasmon waveguide Schottky detector." Optics express 18.8 (2010): 8505-8514.
Cao, Linyou, et al. "Resonant germanium nanoantenna photodetectors." Nano letters 10.4 (2010): 1229-1233.
Hao, Jiaming, et al. "High performance optical absorber based on a plasmonic metamaterial." Applied Physics Letters 96 (2010): 251104.
Atwater, Harry A., and Albert Polman. "Plasmonics for improved photovoltaic devices." Nature materials 9.3 (2010): 205-213.
Liang, Hongyan, et al. "Controlled synthesis of uniform silver nanospheres." The Journal of Physical Chemistry C 114.16 (2010): 7427-7431.
Huang, Jer-Shing, et al. "Atomically flat single-crystalline gold nanostructures for plasmonic nanocircuitry." arXiv preprint arXiv:1004.1961 (2010).
Koo, Kyung-Hoae, and Krishna C. Saraswat. "Study of Performances of Low-k Cu, CNTs, and Optical Interconnects." Nanoelectronic Circuit Design. Springer New York, 2011. 377-407. Abstract only.
Knight, Mark W., et al. "Photodetection with active optical antennas." Science 332.6030 (2011): 702-704.
Zhang, Qiao, et al. "A systematic study of the synthesis of silver nanoplates: is citrate a "magic" reagent?." Journal of the American Chemical Society 133.46 (2011): 18931-18939.
Liu, Na, et al. "Nanoantenna-enhanced gas sensing in a single tailored nanofocus." Nature materials 10.8 (2011): 631-636.
Yu, Nanfang, et al. "Light propagation with phase discontinuities: generalized laws of reflection and refraction." science 334.6054 (2011): 333-337.
Christopher, Phillip, Hongliang Xin, and Suljo Linic. "Visible-light-enhanced catalytic oxidation reactions on plasmonic silver nanostructures." Nature chemistry 3.6 (2011): 467-472. Abstract only.
Mukherjee, Shaunak, et al. "Hot electrons do the impossible: plasmon-induced dissociation of H2 on Au." Nano letters 13.1 (2012): 240-247.
Fedotov, V. A., T. Uchino, and J. Y. Ou. "Low-loss plasmonic metamaterial based on epitaxial gold monocrystal film." Optics express 20.9 (2012): 9545-9550.
Park, Jong Hyuk, et al. "Single-Crystalline Silver Films for Plasmonics." Advanced Materials 24.29 (2012): 3988-3992. Abstract only.
Lu, Yu-Jung, et al. "Plasmonic nanolaser using epitaxially grown silver film." science 337.6093 (2012): 450-453.
Marimuthu, Andiappan, Jianwen Zhang, and Suljo Linic. "Tuning selectivity in propylene epoxidation by plasmon mediated photo-switching of Cu oxidation state." Science 339.6127 (2013): 1590-1593.
Lozano, Gabriel, et al. "Plasmonics for solid-state lighting: enhanced excitation and directional emission of highly efficient light sources." Light: Science & Applications 2.5 (2013): e66.
Lin, Jiao, et al. "Polarization-controlled tunable directional coupling of surface plasmon polaritons." Science 340.6130 (2013): 331-334. Abstract only.
Lee, You-Jin, et al. "Ultrasmooth, highly spherical monocrystalline gold particles for precision plasmonics." ACS nano 7.12 (2013): 11064-11070.
Meinzer, Nina, William L. Barnes, and Ian R. Hooper. "Plasmonic meta-atoms and metasurfaces." Nature Photonics 8.12 (2014): 889-898.
Chalabi, Hamidreza, David Schoen, and Mark L. Brongersma. "Hot-electron photodetection with a plasmonic nanostripe antenna." Nano letters 14.3 (2014): 1374-1380.
Sundararaman, Ravishankar, et al. "Theoretical predictions for hot-carrier generation from surface plasmon decay." Nature communications 5 (2014).
Clavero, César. "Plasmon-induced hot-electron generation at nanoparticle/metal-oxide interfaces for photovoltaic and photocatalytic devices." Nature Photonics 8.2 (2014): 95-103. Abstract only.
Sil, Devika, et al. "Seeing is believing: Hot electron based gold nanoplasmonic optical hydrogen sensor." ACS nano 8.8 (2014): 7755-7762.
Yu, Nanfang, and Federico Capasso. "Flat optics with designer metasurfaces." Nature materials 13.2 (2014): 139-150.
Wu, Yanwen, et al. "Intrinsic optical properties and enhanced plasmonic response of epitaxial silver." Advanced Materials 26.35 (2014): 6106-6110.
High, Alexander A., et al. "Visible-frequency hyperbolic metasurface." Nature 522.7555 (2015): 192-196.
Brongersma, Mark L., Naomi J. Halas, and Peter Nordlander. "Plasmon-induced hot carrier science and technology." Nature nanotechnology 10.1 (2015): 25-34.
Boyes, Edward D., and Pratibha L. Gai. "Visualizing reacting single atoms in chemical reactions: Advancing the frontiers of materials research." MRS Bulletin 40.07 (2015): 600-609. Abstract only.
Agarwal, Rahul, et al. "Real-time observation of morphological transformations in II-VI semiconducting nanobelts via environmental transmission electron microscopy." Nano letters 15.5 (2015): 3303-3308. Abstract only.
Cantarero, Andrés. "Raman Scattering Applied to Materials Science." Procedia Materials Science 9 (2015): 113-122.
Shimura, Takayoshi, et al. "Enhancement of photoluminescence from n-type tensile-strained GeSn wires on an insulator fabricated by lateral liquid-phase epitaxy." Applied Physics Letters 107.22 (2015): 221109. Abstract only.
Krogstrup, P., et al. "Epitaxy of semiconductor-superconductor nanowires." Nature materials 14.4 (2015): 400-406.
Balakumar, S., et al. "Fabrication aspects of germanium on insulator from sputtered Ge on Si-substrates." Electrochemical and solid-state letters 9.5 (2006): G158-G160. Abstract only.
Balasubramaniam, Ramaswamy, and S. Ostrach. "Fluid motion in the Czochralski method of crystal growth." PhysicoChemical Hydrodynamics 5 (1984): 3-18. Abstract only.

(56) References Cited

OTHER PUBLICATIONS

Ishikawa, Yasuhiko, et al. "Strain-induced band gap shrinkage in Ge grown on Si substrate." Applied Physics Letters 82.13 (2003): 2044-2046.

Dosunmu, Olufemi I., et al. "Resonant cavity enhanced Ge photodetectors for 1550 nm operation on reflecting Si substrates." IEEE Journal of selected topics in quantum electronics 10.4 (2004): 694-701.

Kuo, Yu-Hsuan, et al. "Strong quantum-confined Stark effect in germanium quantum-well structures on silicon." Nature 437.7063 (2005): 1334-1336.

* cited by examiner

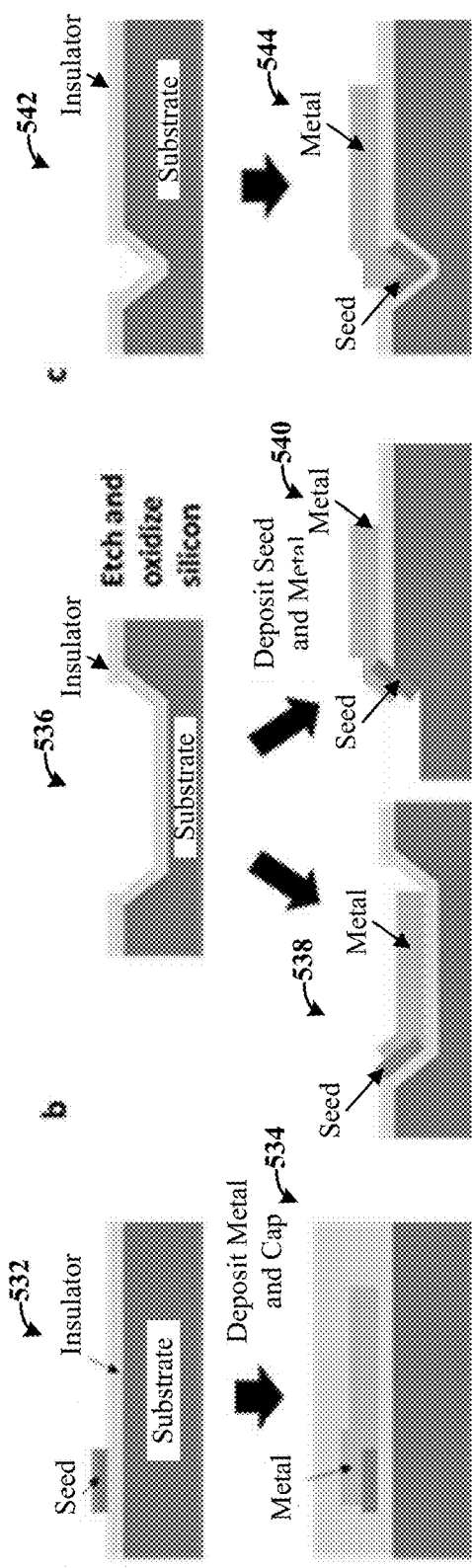

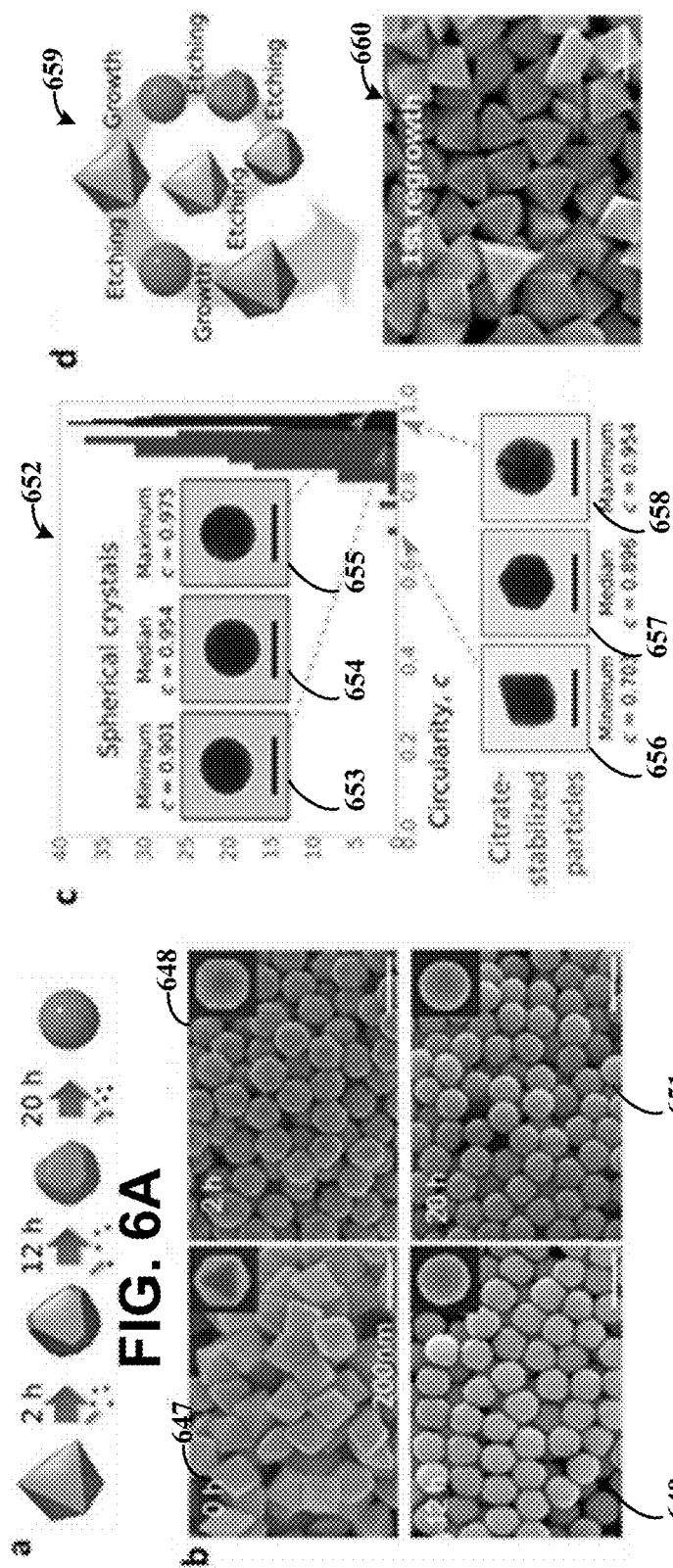

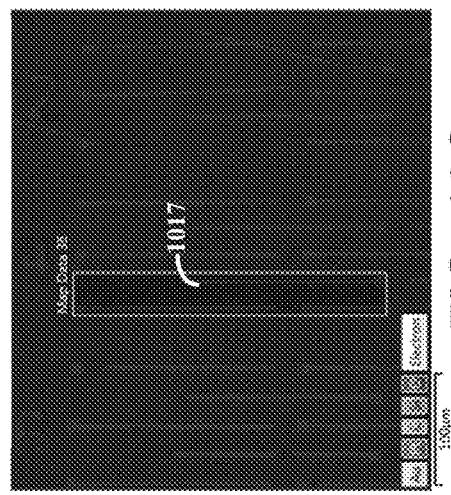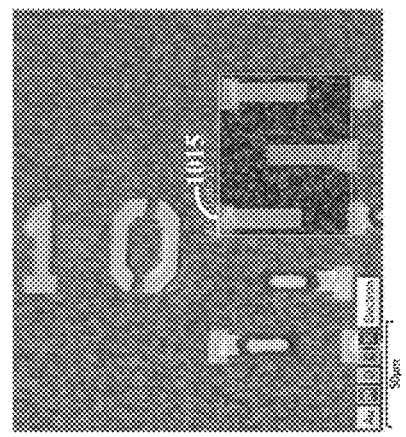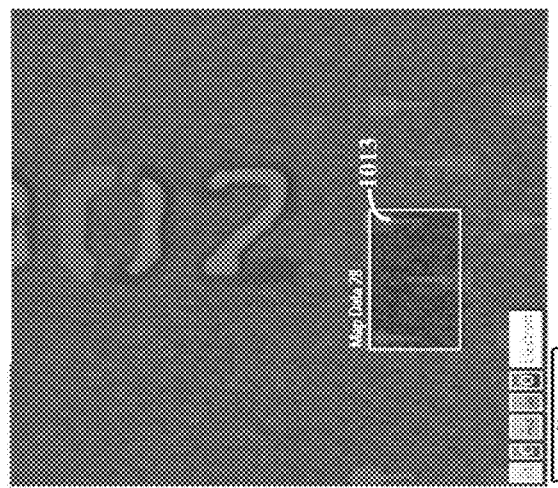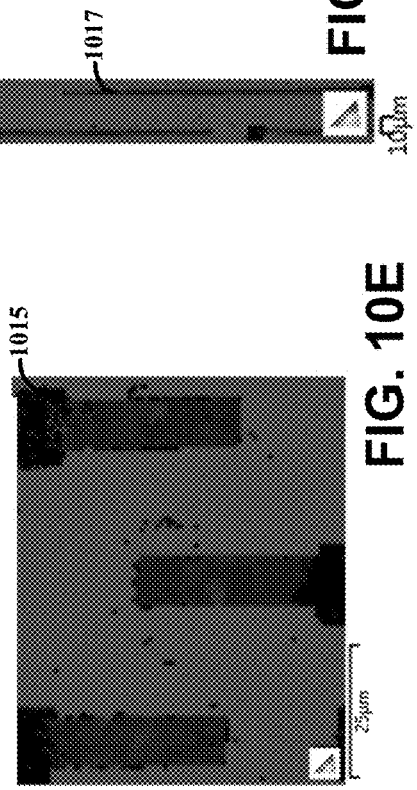

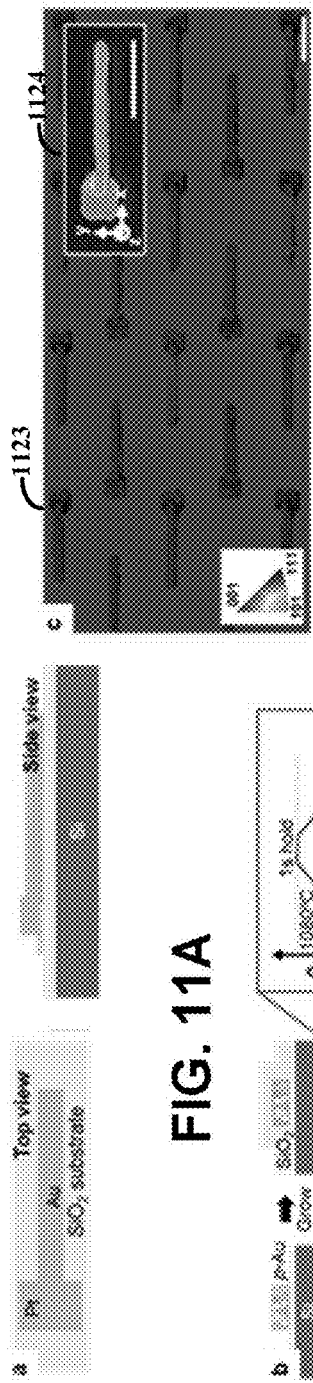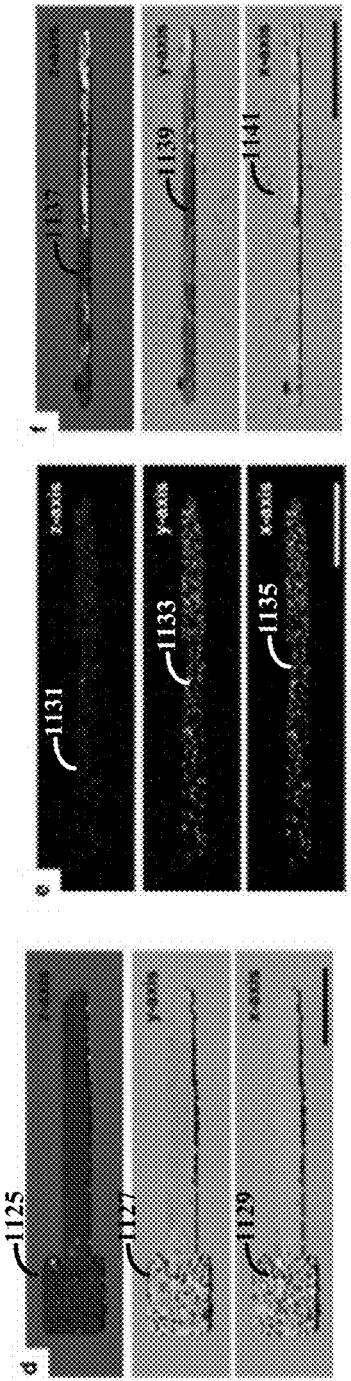
FIG. 11A  FIG. 11B  FIG. 11C  FIG. 11D  FIG. 11E  FIG. 11F

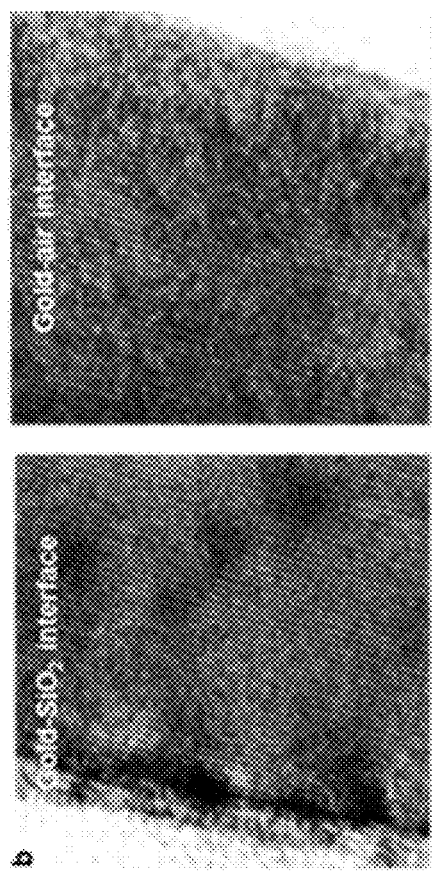

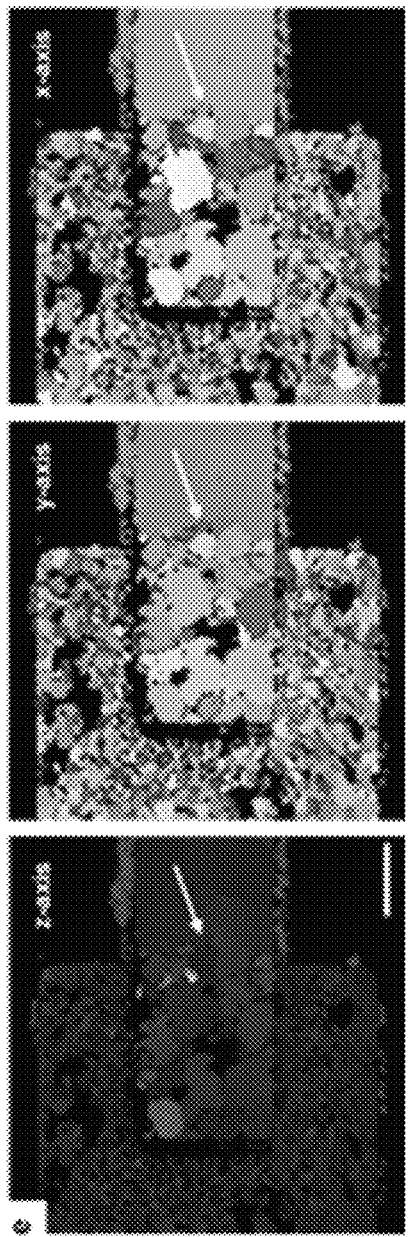

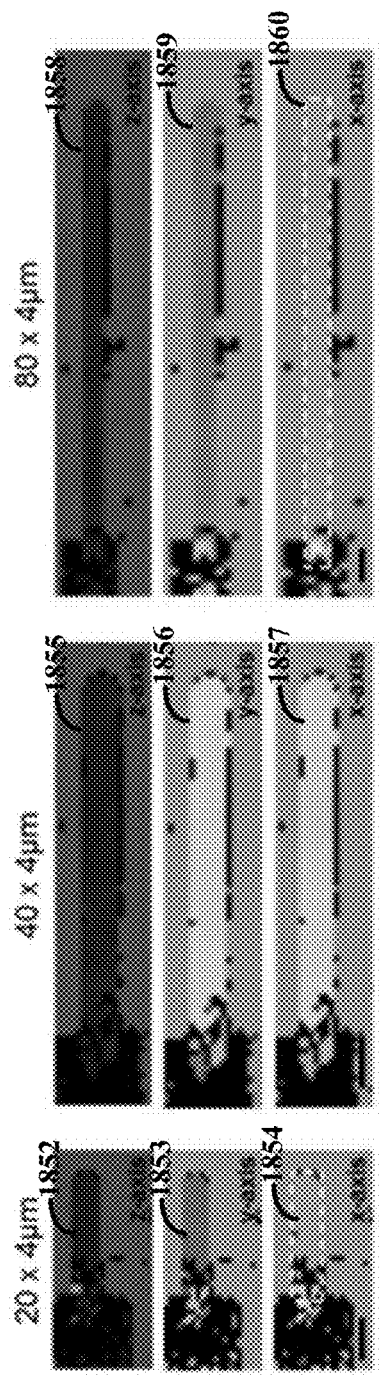
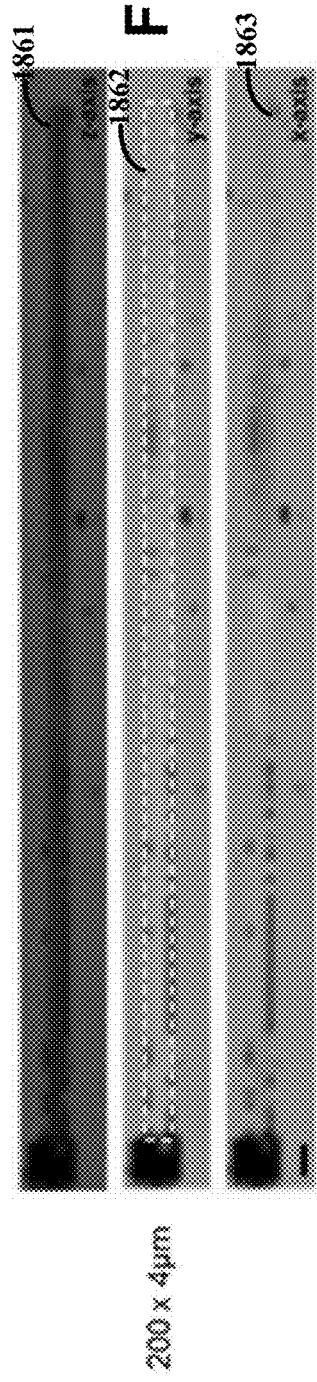
FIG. 18A  FIG. 18B  FIG. 18C  FIG. 18D

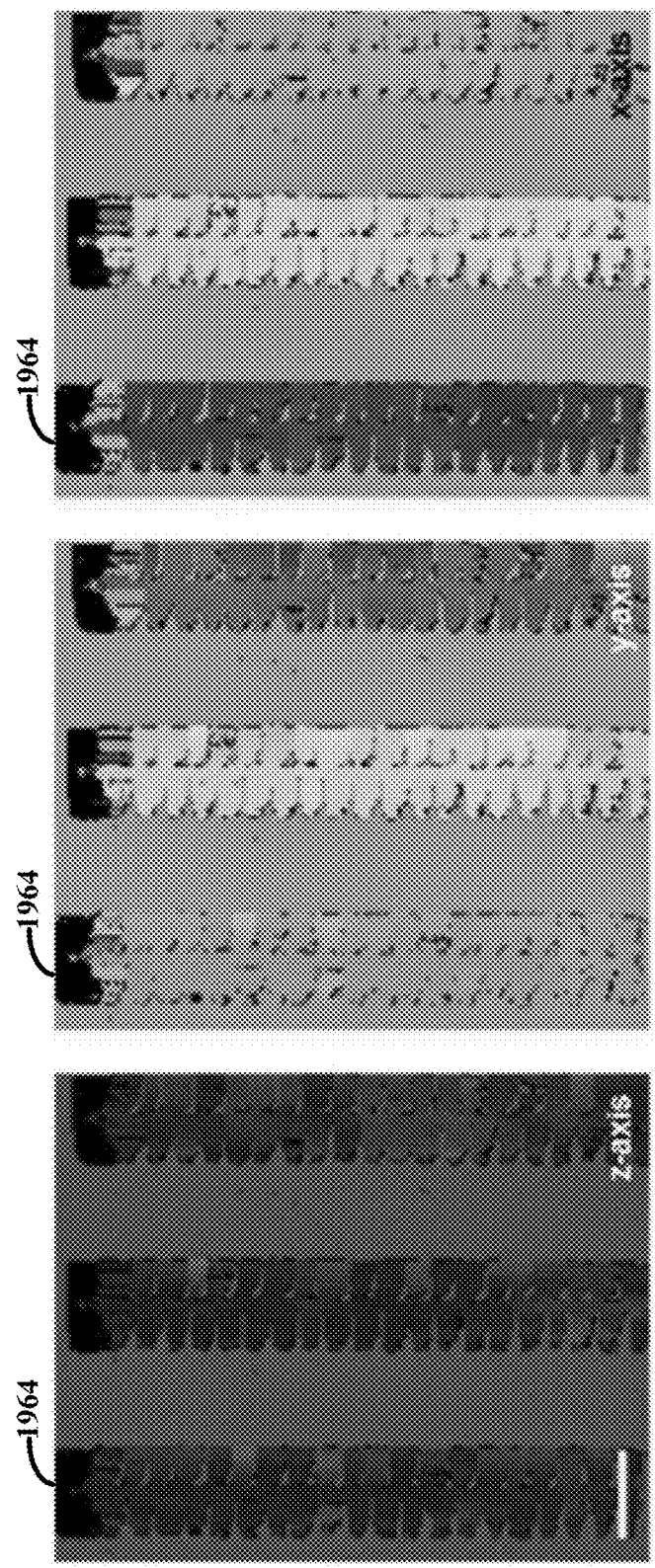

SINGLE METAL CRYSTALS

OVERVIEW

Aspects of various embodiments are directed to single-crystal micro metallic components.

The origins of the 20$^{th}$ century electronics revolution can be traced to breakthroughs in materials. Concepts such as the integrated circuit only became possible with the proliferation of single-crystal silicon substrates, which enabled large area device integration with high speed electronic performance. This interplay between material quality and device performance is also relevant to the field of optics, where the properties of surface plasmon-based "metal optics" systems are dictated by the quality of metal material.

Various example embodiments are directed to, as supported and/or exemplified in the underlying description (without being limited thereto), apparatuses directed to systems, devices, components, assemblies and products (including those completely/partially manufactured) and related methods to use, assemble and/or manufacture such apparatuses.

A number of embodiments of the present disclosure are directed toward a method for creating a single-crystalline metal (or sometimes herein referred to as "single-crystal metal") on a substrate. The method includes liquefying a metal material contained within a crucible while in contact with the substrate, and growing the single-crystalline metal in the crucible by cooling the metal material. For example, the metal material is cooled by causing a temperature gradient effected in the substrate in a direction that is neutral along the surface of the substrate and, therein, the single-crystalline metal is grown in the crucible.

Certain embodiments of the present disclosure are directed to a device that includes a micro-crucible located on a substrate; and a single-crystalline metal in the micro-crucible structure. In related specific embodiments, device includes a plurality of micro-crucibles that in contact with a substrate and contain a single-crystalline metal. At least two of the micro-crucibles have different physical orientations with respect to one another and the substrate, and the single-crystalline metal contained in the at least two micro-crucibles have different crystalline orientations with respect to one another. The single-crystalline metal having different crystalline orientations are respectively formed of a same material or different material with a similar melting point. One or more of the micro-crucibles can have a seed material on an end the respective micro-crucible, and the crystals of the single-crystalline metal can follow an orientation of a grain of the seed material.

Some specific embodiments are directed to methods of creating a single-crystalline metal on a substrate including depositing a metal material and a seed material on a substrate, and encapsulating the metal material and seed material within an insulating material to form a crucible, wherein the seed material is located at an end of crucible. The method further includes liquefying the metal material contained within the crucible, and directing growth of a single-crystalline metal in the crucible in a direction by cooling the metal material using a temperature gradient and based on an orientation of the seed material, wherein the metal material is cooled in a manner that is neutral in the lateral direction. For example, the method includes cooling the metal material by causing a temperature gradient effected in the substrate in a direction that is neutral along the surface of the substrate and, therein, growing the single-crystalline metal in the crucible based on an orientation of the seed material. In specific embodiments, the temperature gradient is imposed by heating and cooling the entire substrate using a heat source that applies uniform temperatures across the entire substrate (e.g., the substrate is heated and cooled at the same rate across the device in a lateral direction).

Embodiments of the present disclosure are directed towards a device that includes a semiconductor chip with an insulator on a semiconductor substrate having a first major surface; a plurality of active circuit components on a first major surface of the substrate; and a plurality of micro single-crystalline metal interconnections connecting the active circuit components.

Various embodiments of the present disclosure are directed toward a device with an insulator on a semiconductor substrate; and a plurality of micro single-crystalline metal lines that are arranged on the insulator, on the semiconductor substrate in a pattern that is configured to provide plasmon resonance.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which:

FIGS. 5A-5C depict several different seeding configurations, consistent with embodiments of the present disclosure;

FIGS. 6A-6D depict aspects relating to the use of refinement of single-crystalline metal, consistent with embodiments of the present disclosure;

FIGS. 10A-10F show images of rectangular single-crystalline metal of different dimensions, consistent with embodiments of the present disclosure;

FIGS. 11A-11F illustrate example device layouts and fabrication processes, consistent with embodiments of the present disclosure;

FIGS. 12A-12F illustrate experiment results of analyzing the resulting devices with atomic resolution using transmission electron microscopy (TEM), consistent with embodiments of the present disclosure;

FIGS. 13A-13G illustrate various experimental results of devices, consistent with embodiments of the present disclosure;

FIGS. 18A-18D illustrate EBSD images of gold microstrips of varying dimensions with a platinum seed, consistent with embodiments of the present disclosure;

FIGS. 19A-19C illustrate EBSD images of tree-like gold microstructures with a platinum seed, consistent with embodiments of the present disclosure;

Figure 1A:
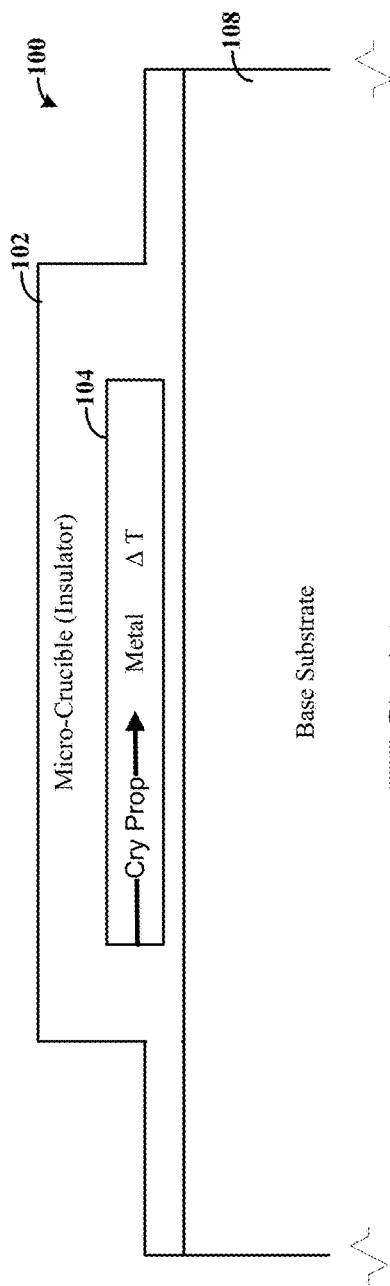
FIGS. 1A-1B depict multiple views of a device for creating single-crystalline metal on a substrate, consistent with embodiments of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving single-crystalline metal structures. In certain implementations, aspects of the present disclosure have been shown to be beneficial when used in the context of semiconductor substrates. In some embodiments, a rapid melt growth process can be used to form single-crystalline metal on semiconductor substrates. These and other aspects can be implemented to address challenges, including those discussed in the background above. While not necessarily so limited, various aspects may be appreciated through a discussion of examples using such exemplary contexts.

Various embodiments of the present disclosure are directed toward the generation of single-crystalline metal devices on conventional semiconductor (e.g., silicon) substrates. Particular embodiments are directed toward an approach that is based on the rapid melt growth (RMG) technique. The approach can include the encapsulation of polycrystalline films of material in an insulating microcrucible and annealing them into single-crystals. Consistent with certain embodiments, single-crystalline metal films of a defined crystal orientation can be created.

Various embodiments are directed toward forming single-crystal metal nanostructures on oxide, nitride or carbide substrates. In particular, oxide substrates can be important for many applications because oxide substrates serve as electrical insulators with a low refractive index and therefore can be used to provide both electrical and optical isolation. In some instances, an oxide layer is formed on an underlying substrate (e.g., an oxide layer on a semiconductor, such as silicon).

Certain embodiments of the present disclosure are directed toward devices and their use in the context of single-crystalline metal interconnects within integrated circuit (IC) chips. The polycrystalline metal interconnects can be susceptible to failure via electromigration and to increased resistivity due to electron scattering off of grain boundaries, which increases power dissipation in the system, which can limit the circuit speed. Aspects of the present disclosure recognize that single-crystal metal technology can be useful for enhancing the reliability of interconnects by reducing or eliminating grain-induced electromigration effects. This is important for consumer electronics and is particularly relevant for space-based technologies, which require electronic components to be reliable over many years of operation. It is also critical for electronics in high temperature environments, where interconnect failure is accelerated. The use of single-crystalline metal can also be useful for reduced resistivity of the interconnection wires, which can help reduce parasitic power consumption in electronic circuits and allow IC chips to communicate using electrical signals that operate at faster speeds.

A variety of embodiments of the present disclosure relate to the devices and their use in the context of single-crystalline metal electrodes for electrophysiology. Electrophysiological measurements, such as single neuron recordings, electroencephalogram (EEG), and Electrocochleography (ECOG) tests in the brain, benefit from electrodes that have good electrical impedance matching with the physiological system and robust mechanical properties. Single-crystalline metal has the low resistivity for a conventional metal electrode system (approaching theoretical limits), making them useful for high performance electrophysiology measurement requiring high spatial precision (i.e., small electrodes). In addition, these materials do not contain the grain boundary defects found in polycrystalline metal films, which can yield fatigue and mechanical failure.

A number of embodiments of the present disclosure are directed toward devices that use single-crystalline metal to provide optical properties used in various reflective, refractive, and metamaterial optical technologies. This can include various optical components, ranging from mirrors to diffraction gratings. The use of single-crystalline metal in these devices can be useful for providing low absorption losses and for reducing or eliminating free electron scattering off of grain boundaries. The use of single-crystalline metal in the thin film optical components, sometimes referred to as metamaterials, can be particularly useful due to the extreme sensitivity of these technologies to absorption losses. The scope of these technologies include, but is not limited to, thin film devices that can control the magnitude and phase response of light in arbitrary ways, waveguides that can guide light below the diffraction limit, and plasmonic-based sensors.

Embodiments of the present disclosure relate to single-crystalline metal that can be used with optical and electronic sensors that are based on hot electrons. For example, hot electron detectors are used commercially to detect infrared and terahertz radiation in optics and are used in electronic sensing platforms for biological measurements requiring high sensitivity and label-free fingerprinting. Single-crystalline metal can be useful for supporting hot electron propagation lengths that are not limited by electron scattering from grain boundaries. Furthermore, their electronic interfaces with semiconductors can be better tailored because they have well-defined work functions.

Certain embodiments of the present disclosure are directed toward substrates for catalysis and photon-based chemistry. Single-crystal metal microstructures and nanostructures have photocatalytic properties that can be useful for applications in chemical reactors and biochemical reaction enhancement. Catalytic preparation that involves the wet chemistry of metal colloids allows only stochastic control over catalyst size and positioning. Single-crystalline metal processed on a wafer can be useful for defining long range position and size control of catalytic surfaces, to be integrated in planar platforms such as microfluidics.

Single-crystalline metal with macroscopic dimensions can be achieved through classical metallurgical means, such as the modified Bridgman method. Here, the starting material is encapsulated in a quartz crucible and is cooled from one end to the other according to a temperature gradient. In particular, the crucible enters a hot zone, during which the material is in the liquid phase. As the material moves gradually into a cold zone, a temperature gradient forms across the quartz crucible as the material solidifies and crystallizes. This temperature gradient follows the orientation of the quartz crucible, and can thereby place corresponding limitations on the geometry and orientations of quartz crucibles. To eliminate competing crystal nucleation processes and to enforce single-crystal growth, the crucible can optionally be formed with a sharp taper (e.g., defined in part by an angle that is acute or preferably less than 20 degrees), which helps to ensure that crystal nucleation initiates at a single spatial point. These approaches can produce millimeter-thick crystalline gold samples.

Somewhat surprisingly, the formation of single-crystalline metal is possible with at least one dimension on the micro-scale (e.g., between 1 micron and 100 microns, and in some instances up to 200 microns) and nano-scale (e.g., between 1 nm and 100 nm, and in some instances up to 900 nm). The process by which this occurs surprisingly allows for the formation of single-crystalline micro and nanostructures on non-lattice matched substrates, without the use of a seed, and without the use of a taper. Further, a single temperature gradient can be used. A single temperature gradient can be imposed across the entire device such that the device does not need to be cooled along a growth path of the single-crystal.

The single temperature gradient can be caused or imposed in various ways. In certain embodiments, this can be achieved by heating and cooling the substrate with the metal material being exposed to a heat source that applies and/or provides uniform temperatures across the entire substrate (e.g., with the substrate being heated and cooled at the same rate across the device in a horizontal direction). In a related and/or more specific approach, the substrate can be heated and cooled using the heat source to cause and/or impose the single temperature gradient in a vertical direction and without a non-uniform temperature gradient in a horizontal (or lateral) direction that would ensue (or manifest) from, and be indicative of, use of a directionally controlled heat source. In certain more-specific embodiments, this approach is proven to be useful in imposing such a temperature gradient without using burdensome steps/equipment (disadvantageous, for example, in commercial/volume manufacturing efforts) as exemplified by zone-melting recrystallization techniques that use moving parts (e.g., moving the substrate relative to the temperature-change/heat source used at different times by directionally controlling the heat source and/or the substrate). In these more-specific embodiments, this temperature gradient can be imposed without a mechanism or tool for controlling the direction of heating or cooling across the substrate in a horizontal direction. Consistent with these embodiments, an exemplary implementation uses a temperature substrate-processing station (or chamber) configured and arranged to control the temperature-change delivery (e.g., cooling effort) by ensuring that the heat/cooling source (used to effect the temperature change) is controlled in a manner that fixes the source relative to the position of the substrate (e.g., without imposing forces that would change temperature applied to the substrate in a horizontal (lateral) direction). Such control over the source used to cool the metal material (in contact with the substrate) can be considered as effecting a cooling property that is neutral in a direction along the operative surface of the substrate (or "lateral-direction neutral") This cooling-specific approach can be particularly useful for facilitating orientations of multiple single-crystalline metal that does not follow a common orientation relative to a temperature cooling gradient for the cooling process. Thus, the structures can be arranged in any number of different orientations relative to one another without being limited by a directionality for a temperature cooling gradient.

Moreover, without a seed, random nucleation within the crucible was expected to occur, which can lead to the formation of polycrystalline structures. Surprisingly, single crystalline metal can be formed in the absence of a seed. Moreover, prior uses of seeds with germanium and silicon showed a correlation between seed orientation and the crystal orientation. Surprisingly, there does not appear to be a strong (or even any) dependence between the seed orientation and crystal orientation for metal crystal created according to embodiments discussed herein. Accordingly, it is possible to use an amorphous seed while still controlling the direction of the crystal orientation.

These surprising findings can be particularly useful for providing a robust and simple manufacturing process that is capable of producing a wide range of different structures and patterns. For example, the ability to have a cooling gradient, that is neutral in the lateral direction, can facilitate the creation of complex metallic patterns with a variety of different shapes, sizes, and features. For instance, different portions of the same structure (such as an IC chip) can be used to create different optical elements (e.g., plasmonic gratings) that are formed from metal structures that are oriented in different directions for the different gratings. These can be formed in a single RMG process and in close proximity to one another (e.g., whereas multiple melting processes with different temperature gradients can be difficult or impossible without disrupting crystals formed in prior steps). Similarly, complex metal wiring interconnects can be created in numerous directions and even on different wiring/metallization layers. Moreover, antennae, inductive elements, sensors, and other structures that might benefit from multiple metallic features in different directions, orientations, and sizes can be created.

Figure 1B:
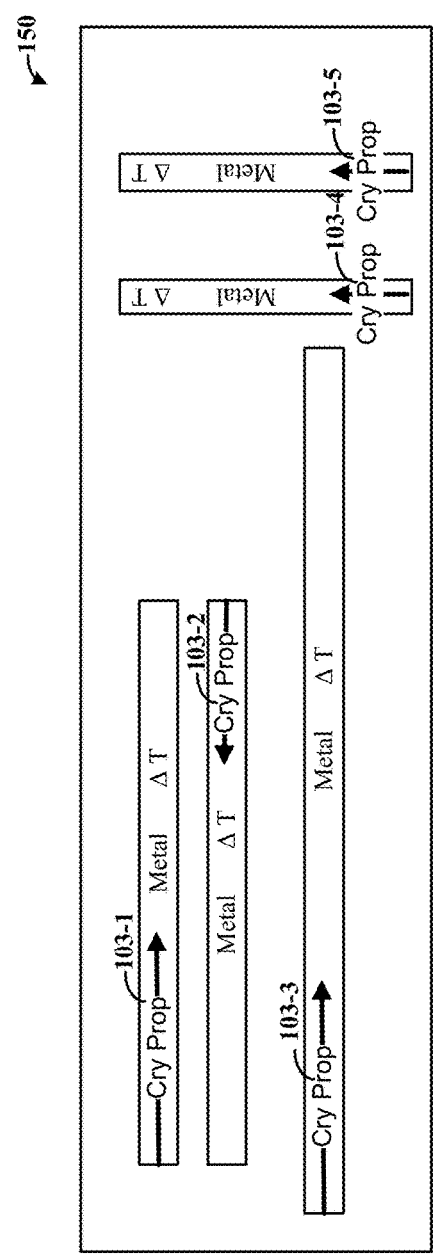

Turning now to the figures, FIGS. 1A-1B depict multiple views of a device for creating single-crystalline metal in contact with a surface of a substrate, consistent with embodiments of the present disclosure. View 100 illustrated by FIG. 1A shows a side view of a device having a metal portion 104 contained within a micro-crucible 102 and located on and/or in contact with a surface of the substrate 108. In certain embodiments, the metal portion 104 can be a noble or non-noble metal, such as ruthenium, rhodium, palladium, silver, osmium, iridium, platinum, or gold. In various embodiments, the metal material is a noble metal, a transition metal, an alkali metal, and/or alkaline metal. The substrate 108 can, in various embodiments, be a semiconductor material, such as silicon, silicon-based or germanium. It is noted, however, that a variety of other substrate types are also possible. The substrate 108 includes a layer of material and/or multiple layers of different material, in various embodiments. The micro-crucible 102 can be made from a material that is unreactive with the metal and also capable of withstanding heat in excess of the melting point of the metal. For instance, the micro-crucible 102 can be made from various oxides or nitrides (e.g., silicon oxide or silicon-nitride).

View 150 illustrated by FIG. 1B shows a top-down view of a device, consistent with embodiments of the present disclosure. The top-down view shows a plurality of different metal portions that can be arranged according to the desired use of the device. For example, the metal portions can be used to connect circuit components on an IC chip, create a diffraction grating for an optical device, or to provide sensor electrodes for a sensor, among various other uses. Moreover, various devices may include only a single metal portion.

While FIGS. 1A-1B show an insulator layer that is located on a separate substrate, various embodiments allow for one or more polycrystalline metal portions (or "patterns") to be defined directly onto an insulating layer or substrate. For instance, a metal layer can be deposited on the insulating material, whether the deposition is on an insulating layer covering a separate substrate material or the deposition is directly onto an insulating layer or substrate. In either case, the metal layer can then be patterned using an appropriate etching process, such as using a mask created by photolithography.

According to some embodiments, trenches can be formed in the insulating layer or substrate before the deposition of the metal layer. In certain embodiments, the creation of the patterns can be accomplished using a lithographic process in which a photoresist mask is used to create the metal patterns. Various different types of etching processes can be used depending on the particular application and materials. The relative size of the metal patterns can vary according to the particular application. For example, the lengths and widths can range from the nanoscale (e.g., structures tens of nanometers long) to the macroscale (e.g., structures multiple millimeters long). Crystalline metal structures with nanoscale dimensions can be particularly useful in metal optics applications, where the size of the device is on the order of the wavelength or smaller. For visible light (wavelengths of about 400-700 nm), the dimensions can be on nanoscale, and for infrared devices (wavelengths of about 1-10 microns) the dimensions can transition from nano to micro-scale. For integrated photonics applications on a chip, such as metal optical waveguides, modulators, and detectors, the relevant length scales can range from a few- to many microns. For applications in metal interconnects, the length scales can be multi-scalar, ranging from the nanoscale at the transistor level to the millimeter/centimeter scale at the power bus level. For electrode applications, such as devices probing systems at the cellular level, the dimensions can be at the nanoscale, while devices probing systems at the tissue level can use dimensions at the micro- or macro-scale, depending on the application.

The metal patterns can then be encapsulated by creation of an additional layer of insulating material over the metal patterns. For instance, a nitride or oxide cap can be formed to enclose all of the metal patterns in respective microcrucibles. The crucible and the substrate encapsulate the metal material. At least a surface of the crucible (e.g., the insulating material) can be in contact with the encapsulated metal material. A micro-crucible can include or refer to a crucible having one or more dimensions less than a millimeter.

The samples can then be subjected to a rapid thermal annealing process to bring the metal to a liquid phase. As discussed herein, the temperature can be set just above the melting point of the metal. The metal can then be allowed to cool so as to form a single-crystalline metal within the crucibles. Surprisingly it has been discovered, that heating the substrate, having the metal encapsulated, can result in the metal material diffusing together (with material of the substrate and/or seed material) to form a solid prior to reaching the melting point of the metal material, and the diffused solid forms a metal-insulator interface from which crystal growth propagates. Depending upon the desired application, the encapsulating layers of insulating material can then be etched away and additional processing can be performed.

As illustrated by view 150 of FIG. 1B, the resulting device can include formed metal structures that are oriented in different directions. The metal structures can propagate in different directions, with respect to one another, as illustrated by the arrows 103-1, 103-2, 103-3, 103-4, 103-5. The metal that forms the metal structures can be grown via the above-described process and can include single-crystalline metal structures. The orientation of the single-crystals, sometimes herein referred to as the crystalline orientation, can align with a physical orientation of the crucible. For example, a seed material located with the crucible can be used to direct the crystalline orientation, such as to align with the physical orientation of the crucible structure. Accordingly, in various embodiments, two or more crucibles (having seed material) can be oriented differently with respect to the substrate and each other and, further, the single-crystalline structures grown have crystalline orientations that are different with respect to each other. The metal forming the metal structures can include the same metal or similar metals, in various specific embodiments. Similar metals include or refer to metals having similar melting points (e.g., the same melting point or within a threshold percentage, such as 10 or 20 percent degrees C.).

The metal structures are formed using a single temperature gradient across the entire device. As used herein, the single temperature gradient includes or refers to a temperature gradient that is in a vertical direction of the device (e.g., in the stacked direction of the layers of substrate to metal material to crucible material). The temperature gradient can be imposed on the device by heating the entire device (e.g., the substrate having the metal, seed, and crucible materials) using a heat source that applies and/or provides a uniform temperature and/or temperatures across the entire device and removing the heat source from (and/or applying a cooling source to) the entire device at the same rate across the device (e.g., the substrate is heated and cooled at the same rate across the device in a lateral direction). Horizontal (lateral) and vertical directions with respect to the substrate, as used herein, are with reference to the view of the device in FIG. 1A. In specific embodiments, vertical direction with respect to the substrate refers to the stacked direction of layers including the substrate, metal material, and crucible material. The lateral direction with respect to the substrates refers to the surface (e.g., operative surface) of the substrate and/or a direction perpendicular to the vertical direction. The process of heating and cooling the substrate using the heat source can cause and/or impose the single temperature gradient in the vertical direction and without a temperature gradient in a horizontal (or lateral) direction that would ensue (or manifest) from, and be indicative of, use of a directionally controlled heat source. Examples of heat sources (and/or heat sources and cooling sources or combination heat and cooling source) and techniques include furnace annealing, rapid thermal annealing, laser annealing, and flash annealing, among other sources of heat. The heat source can apply uniform temperatures horizontally (laterally) across and/or around the surface of the entire substrate (e.g., across the operative surface).

Example temperature gradients can include cooling gradients, heating gradients, and/or both. For example, a cooling temperature gradient includes or refers to the direction and rate at which the temperature is cooled across the device. As an example of a temperature (e.g., cooling) gradient that is imposed on the device, the entire device is cooled by removing the heat source at the same rate across the entire device (e.g., drops X amount of degrees per second for the entire device), which may form a temperature gradient in the vertical direction of the substrate. In specific embodiments, the heat source is removed (e.g., no heat applied) and the device is allowed to cool naturally. The temperature gradient may not be controlled directionally (e.g., the heating and/or cooling temperature gradient is not intentionally imposed by controlling the heating and/or cooling of the device in a horizontal or lateral direction of the device) with respect to the substrate and not controlled with respect to a directional propagation (e.g., growth) of the single-crystalline metal structures. Thereby, the cooling can be uncontrolled directionally in various embodiments (e.g., not from one end of the device to the other). Further, the device (e.g., the substrate) is cooled using the temperature gradient which results in cooling the metal material encapsulated within the insulating material in a manner that controls the temperature change such that the effect of delta-temperature is neutral in a direction that is lateral (along the upper/operative surface of the substrate).

Particular embodiments are directed toward the use of such a process in the formation of single-crystalline gold and platinum with micron-scale grain sizes.

Figures 1C, 1D, 1E:
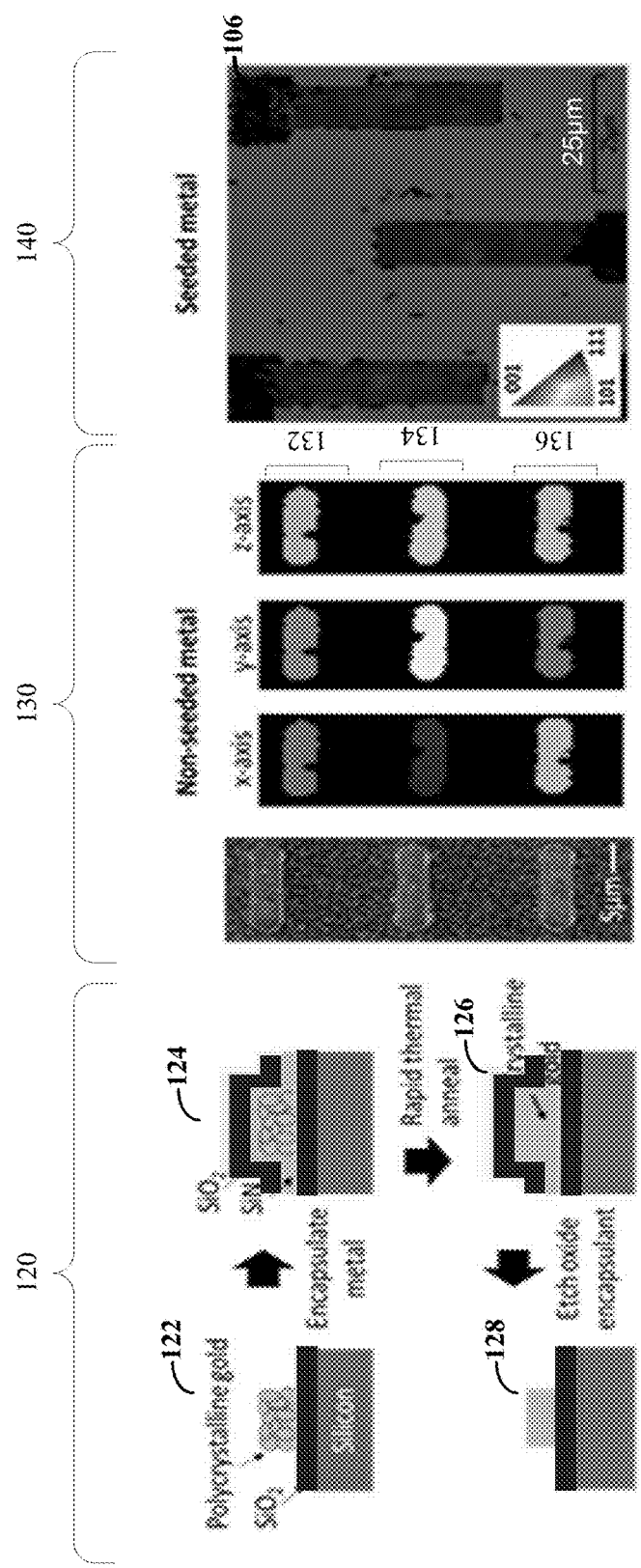
FIGS. 1C-1E show a side view for multiple process stages and imaging results for single-crystalline metals, consistent with embodiments of the present disclosure.

FIGS. 1C-1E show a side view for multiple process stages and imaging results for single-crystalline metal, consistent with embodiments of the present disclosure. Section 120 illustrated by FIG. 1C shows various stages of a device as polycrystalline metal films are processed using a rapid growth method. This includes patterning the metal on an oxidized silicon wafer, per view 122. The metal is then encapsulated with a nitride and oxide cap, per view 124. Rapid thermal annealing is used to form a single crystal, per view 126. Optionally, the cap can be removed (e.g., using dry etching) as shown in view 128.

Section 130 illustrated by FIG. 1D shows imaging of crystalline gold films after processing with rapid growth method conditions and without the use of a seed. The gold microstructures can be formed into single crystals with different crystal orientations (e.g., <001>, <101>, <111>) that occur at a distribution that is approximately equal/random. For instance, microstructure 132 is oriented at <001> along the X-axis, while microstructure 134 is oriented at <111> and microstructure 136 is oriented at <101>, each also for the X-axis.

A seeded material can be used, in various embodiments, to direct growth of the single-crystalline metal structures in a specific direction (e.g., control the growth direction). As further described herein, the seeded material can be amorphous and/or include a poly-crystalline material. In specific embodiments, the seeded material can be deposited and can have an amorphous structure and/or may not include a taper. Further, the seeded material may not be tapered, in various embodiments, and can direct the growth direction of the single-crystalline metal structures. Section 140 illustrated by FIG. 1E shows imaging of seeded single crystal gold microstructures (e.g., as illustrated by the particular single-crystalline structure 106). These microstructures each had an <111> orientation (z-axis) after processing with rapid growth method. Thus, for seeded structures, the gold microstructures consistently formed into single crystals with well-defined <111> crystal orientation in the z-direction. In particular, experimental testing suggested that at least 95% of the structures were single crystals with <111> orientation in the z-direction. It is noted that further refinements are expected to improve upon this percentage.

Figure 2:
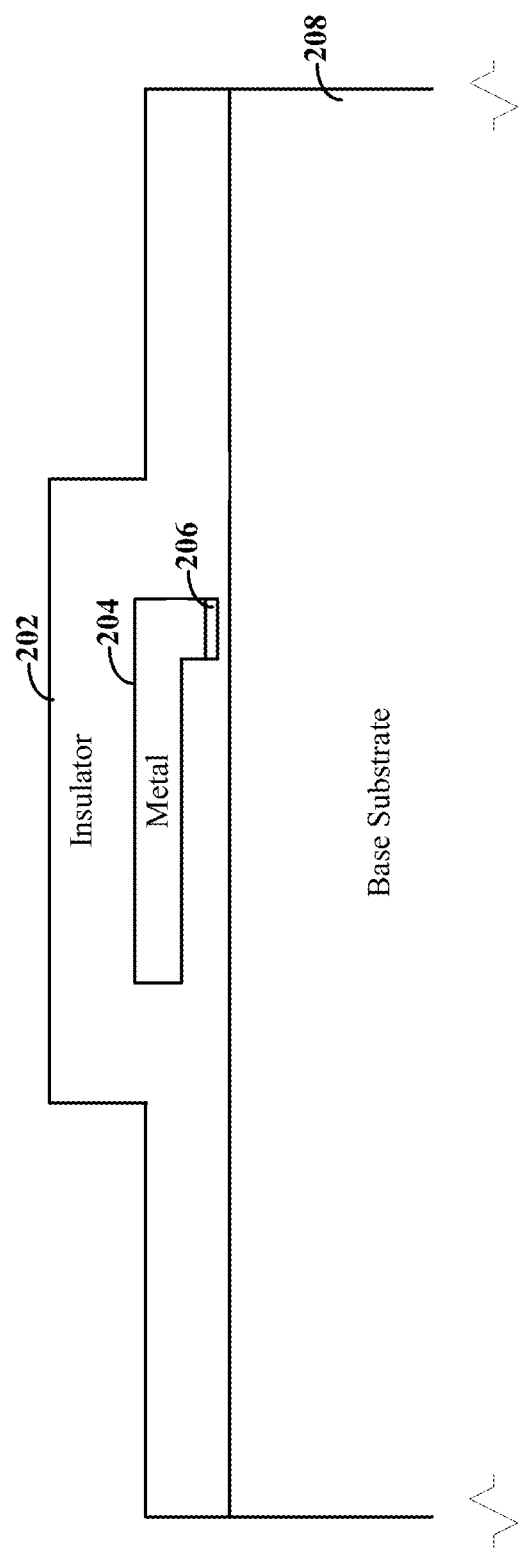
FIG. 2 depicts a side view of a device for creating single-crystalline metal on a substrate using a seed for the formation of the crystal, consistent with embodiments of the present disclosure.

FIG. 2 depicts a side view of a device for creating single-crystalline metal on a substrate using a seed for the formation of the crystal, consistent with embodiments of the present disclosure. Similar to the discussion of FIGS. 1A-1B, FIG. 2 shows a side view of a device having a metal portion 204 contained within a micro-crucible 202 and located on a base substrate 208. In addition, FIG. 2 includes a seed material 206. The seed material includes or refers to a different type of metal than the metal material. For example, the seed material 206 can have a different melting point (e.g., a higher melting point) than the metal material. This seed material 206 can be used to provide a consistent nucleation site for the metal portion 204. In the depicted example, the seed is placed (e.g., located) at an end of the crucible. However, embodiments are not so limited and the seed can be placed at a variety of locations of the crucible (e.g., the bottom).

Other metal combinations are also possible. For example, the metal portion 204 can be gold, while the seed can be made of platinum. Gold and platinum have an eye-type phase diagram and do not form a eutectic like gold and silicon, making these materials compatible with the RMG process. Other metal combinations of metal-seed material pairings are also possible. For example, a broad range of pairings can be used where the seed material has a higher melting point than the metal. It can also be relevant to consider the eutectic temperature of the seed material with respect to the crystal-forming metal, as the eutectic temperature can be significantly lower than the melting point. A few example material pairings that can be particularly relevant for use with plasmonic and electronic applications include gold-platinum, silver-platinum, and copper-platinum. Those metal materials can also be used with tungsten, nickel, or silicide seeds.

As discussed herein, the use of a seed material may be beneficial for helping to control the orientation of the crystal and for decreasing the defect rate in the formation of single-crystalline metal portions. In certain embodiments, the seed material is placed within a recess (as shown in FIG. 2); however, the seed material can be placed in a variety of different orientations, some of which are expressly discussed in more detail herein. In various embodiments, the seed material can be used to direct the crystalline orientation of the single-crystalline metal. For example, the seed material can direct the crystalline orientation to align with a physical orientation of the crucible.

Figure 3:
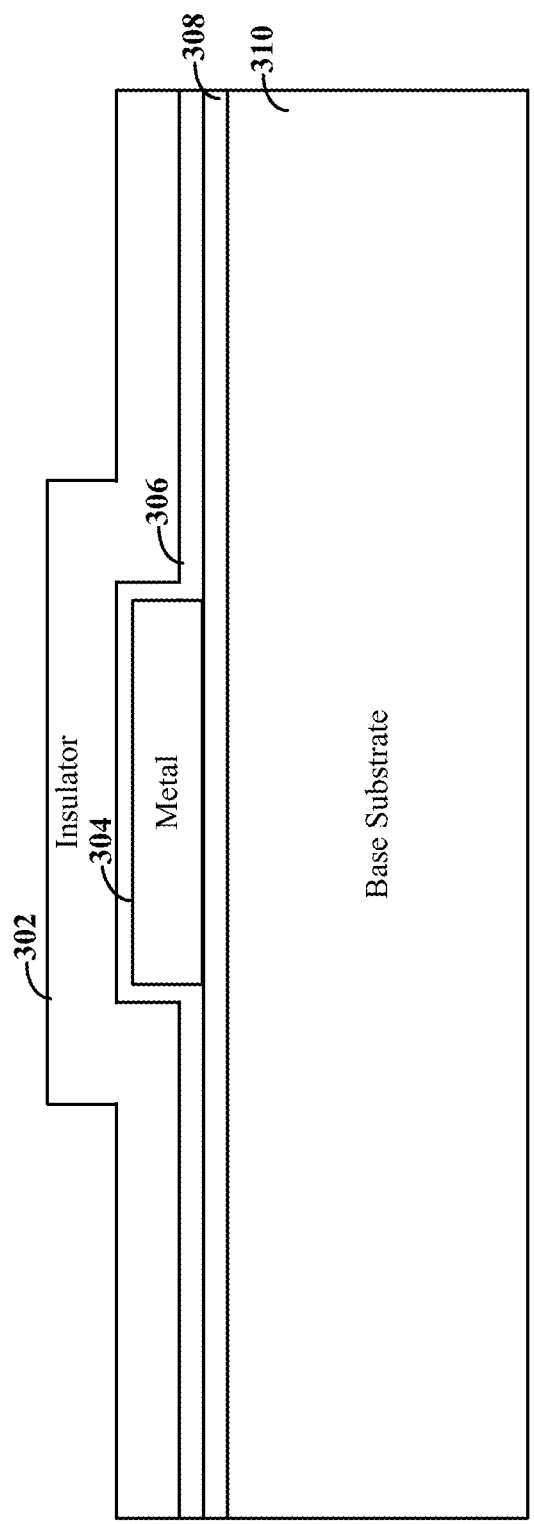
FIG. 3 depicts a side view of a device for creating single-crystalline metal on a substrate using two or more crucible layers in the formation of the crystal, consistent with embodiments of the present disclosure.

FIG. 3 depicts a side view of a device for creating single-crystalline metal on a substrate using crucibles with two or more layers in the formation of the crystal, consistent with embodiments of the present disclosure. Similar to the discussion of FIGS. 1A-E and 2, FIG. 3 shows a side view of a device having a metal portion 304 contained within a micro-crucible (sometimes herein referred to as a "micro-crucible") and located on a base substrate 310. While the micro-crucible is depicted as including an insulating base layer 308 and two additional cap layers 302 and 306, additional layers can also be used. The base layer 308 and additional cap layers 302 and 306 can be made of various combinations of different materials that are non-reactive with the metal portion 304. For example, base layer 308 and cap layer 302 can be oxides (e.g., silicon oxide), while the cap layer 306 can be a nitride (e.g., silicon nitride ($Si_xN_y$)). The use of multiple layers can facilitate the use of a wide variety of materials that are both thermally and chemically compatible with both the metal and seed (if any) materials. More particularly, the crucible materials can be selected based upon their ability to withstand temperatures around the melting point of the metal to be crystallized, including consideration of any melting point for the crucible material and thermal expansion of the crucible materials and the metal. A range of different oxides, nitrides and carbides can be used, although these are merely examples and other crucible materials can be used. In some applications, the crucible materials can be selected based upon their large bandgap or upon other properties.

Various embodiments are directed toward controlling the dimensions of the crucible layer to be sufficient to maintain structural integrity during heating. For instance, if the crucible material is too thin (e.g., around or less than 1 micron for temperatures near the melting point of gold) the crucible can deform and break (e.g., due to thermal expansion of the metal and crucible materials). This can lead to the formation of polycrystalline structures and significant reduction in yield for the metal structures.

Various embodiments are directed toward the concepts and structures from FIGS. 1A-3 used in different combinations and configurations. For example, a seeding material can be used in conjunction with an additional cap layer. Moreover, combinations of the different embodiments can be implemented on the same base substrate. For example, some of the metal portions can be seeded, while others are not. This might be useful, for example, when the device is using the single-crystalline metal for different purposes. For example, the device may include both optical and electrical portions, which might use the single-crystalline metal in different manners. It may, therefore, be beneficial to create the various single-crystalline metal portions using different parameters (e.g., different types of metal material, physical dimensions, other variations, and combinations thereof) and different processes (e.g., seeding vs. not seeding, multiple vs. single cap layers, other variations, and combinations thereof), depending on the desired use of each metal portion.

Figure 4:
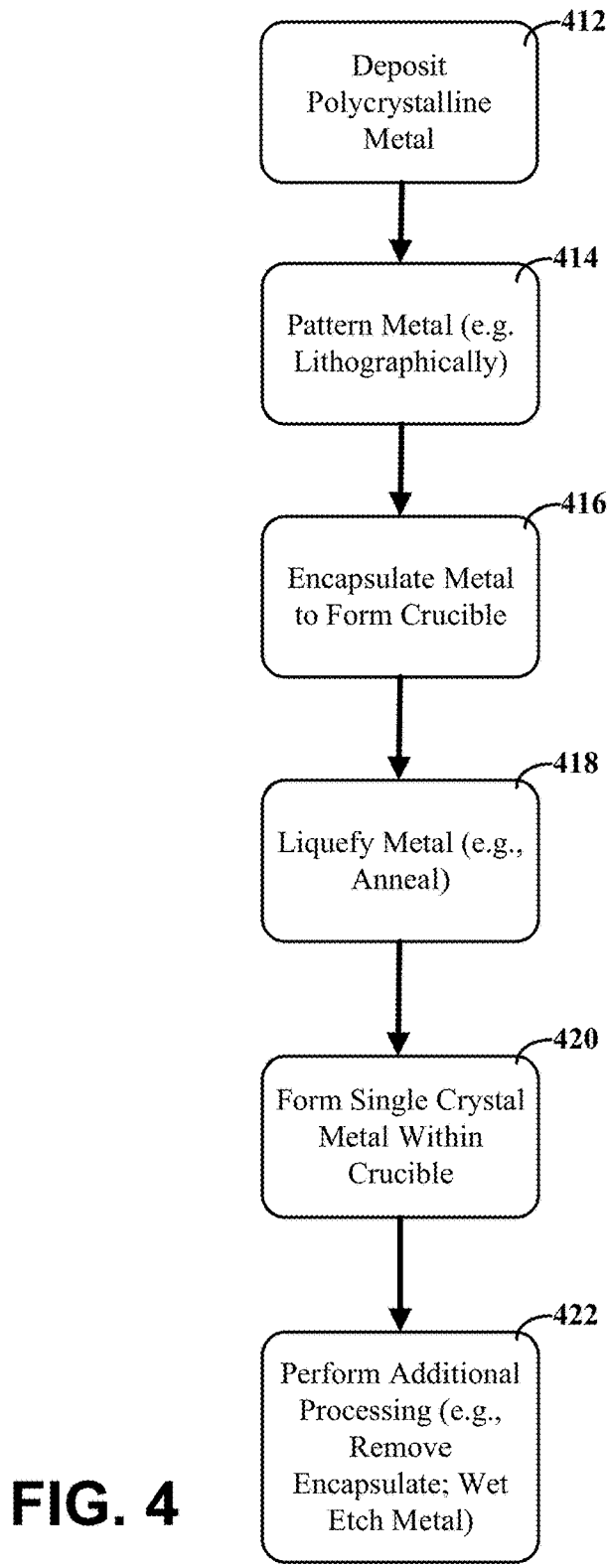
FIG. 4 depicts a flow diagram for creating single-crystalline metal portions, consistent with embodiments of the present disclosure.

FIG. 4 depicts a flow diagram for creating single-crystalline metal portions, consistent with embodiments of the present disclosure. A layer of polycrystalline metal can be deposited on a non-reactive layer, such as a silicon oxide layer, per block 412. The deposition can be done using a variety of techniques including, but not necessarily limited to, electron beam evaporation, sputtering, thermal evaporation, electroplating, chemical vapor deposition, atomic layer deposition, and chemical drop casting. Consistent with various embodiments, the deposition layer can have a thickness of a few tens of nanometers to several microns.

The deposited metal layer can then be patterned to produce micro-sized metal patterns, per block 414. The patterning can be carried out using various etching techniques including, but not necessarily limited to, photolithography, wet etch, plasma etch, and combinations thereof.

In various embodiments, the deposition process can be varied for portions of the substrate. For example, multiple different types of single-crystalline metal can be formed on the same device and substrate. This might include the use of selective deposition of different metals in different physical locations on the substrate, sequential deposition and etching for different metals, and combinations thereof.

The patterned metal can then be encapsulated to form crucibles containing the patterned metal, per block 416. The encapsulation can include forming a cap over the patterned metal, where the cap includes one or more layers that are substantially non-reactive with the metal. In particular embodiments, the layers are one or both of electrically insulating and optically insulating (e.g., silicon oxide and silicon nitride).

The patterned metal is then heated/annealed to above its melting point so that it enters a liquid phase, per block 418. For example, the substrate and/or device can be heated to a temperature that is at or above the melting point of the metal material (and, optionally, below the melting point of the seed material). In certain embodiments, the heating can be part of a rapid melt growth (RMG) process in which the temperature is heated to only slightly above the melting point. Limiting the temperature in this manner can be useful for avoiding unnecessary heating and for promoting crystalline growth. For instance, gold has a melting point of about 1,064° C. and heating can be to about 1,100° C., which is within about 3.3%. Consistent with this example, various embodiments allow for the temperature of the metal to be raised to just at the melting point, several degrees above the melting point, or even significantly above the melting point (e.g., 50 to 60 degrees in excess for gold). The particular temperature can be taken into account when selecting crucible and seed materials, as well as determining an order for process steps in manufacturing a device. For example, process steps involving materials that melt or might otherwise be damaged by the particular temperature can be undertaken after the formation of the single-crystalline metal structures.

A single-crystalline metal can then be formed within the crucible by cooling the metal, per block 420. As previously described, a temperature gradient can be imposed on the device by heating the entire device using a heat source and cooling the device by removing the heat source from the device (and allowing the device to naturally cool) and/or by otherwise applying a cooling source (which may be the heat source and/or another source). The temperature gradient used can result in the metal material being cooled in a direction that is neutral along the lateral (upper operative) surface of the substrate. According to embodiments of the present disclosure, the cooling profile can be adjusted for different materials, different crucible configurations, and other factors. In particular embodiments, the metal nucleates with <111> orientation when a seed is used.

Optionally, additional processing steps can then be performed on the device, per block 422. For example, the additional processing might include removing a portion of the encapsulate crucible to further process metal (e.g., by etching the surface of the metal). Removing the portion of the crucible can expose a surface of the single-crystalline metal. The surface can be removed using an etch process, such as a wet etch. The exposed surface can be used, in specific embodiments, as a template for wet chemical metal growth. In other embodiments, a different type of metal can be deposited on the exposed surface, such as by using a selective electrochemical deposition technique. In some instances, circuit components can be created on the substrate. Some of these circuit components can be connected by the patterned metal.

As discussed in connection with FIG. 1B, for non-seeded structures, the gold microstructures form into single crystals with different crystal orientations (e.g., <001>, <101>, <111>) that occur at a distribution that is approximately equal/random. For seeded structures, the gold microstructures consistently formed into single crystals with well-defined <111> crystal orientation in the z-direction. In particular, experimental testing suggested that at least 95% of the structures were single crystals with <111> orientation in the z-direction. It is noted that further refinements are expected to improve upon this percentage.

Various embodiments include aspects that are based upon the recognition that crystallization initiates when a solid is formed from the metal material diffusing together with the seed material to form the solid (sometimes herein referred to as a "diffused solid"). Surprisingly it has been discovered, that heating the substrate, having the metal material encapsulated, results in the metal material diffusing together (with material of the substrate and/or seed material) to form the solid prior to reaching the melting point of the metal material. The diffused solid exhibits and/or has a melting point that is higher than the melting point of the metal material and forms a metal-insulator interface from which crystal growth propagates.

The various embodiments discussed herein are provided as examples and are not meant to be limiting. For instance, experimental testing relating to the nucleation process of gold on both platinum and silicon dioxide can be used to further refine and adjust the processes used to generate single-crystalline metal. This testing might include, for example, a series of studies at high temperatures using transmission electron microscopy (TEM). A TEM can combine in situ heating with atomic scale imaging, thereby capturing the evolution of gold melting and solidification with high spatial resolution.

In certain instances, gold nanostructures on a platinum substrate can be heated until they reach their liquid phase so the liquid and solidifying gold can be monitored and characterized as it cools down. This could include the use of a Dens Nano-Chip XT grid, which is a microelectromechanical system (MEMS)-based TEM grid that can heat up to 1,300° C. via an integrated silicon nitride heater and read out the temperature by four point probe. To prepare the samples, a 20 nm-thick layer of platinum can be deposited onto a section of the Nano-Chip grid via shadowmask, which can mimic a platinum seed. A dilute solution of 20 nm-diameter gold nanoparticles can then be drop cast onto the grid. The chip can then be loaded into the TEM, where the sample is heated to 1,100° C. to melt the gold particles, and then cooled at a controlled rate until the particles solidify.

To verify for consistency with the theoretical nucleation, the temperatures at which the liquid gold nanoparticles solidify can be recorded, e.g., by recording the diffraction pattern from the gold nanoparticles and recording the temperatures during which the diffraction patterns undergo a discontinuity, i.e., when the particles solidify. The data can be correlated against plots to verify the corresponding nucleation model.

It is noted that the nucleation model is based on equilibrium dynamics, and that strong deviations from this model can occur when the undercooling rate is very fast. For example, too much undercooling may cause multiple random nucleation sites to occur, yielding polycrystalline metal formation. Accordingly, various embodiments allow for the use of a variety of different cooling profiles, including cooling rates that range from relatively slow (around 5° C./s) to relatively fast (100° C./s). These types of precise heating variations are possible with the Dens Nano-Chip, which controls heating using electronics with a closed feedback loop.

Similar experiments with various combinations of different types of metal nanoparticles and different interface material (e.g., silicon dioxide) can be used to characterize solidification temperatures and crystal orientation for multiple particles. These measurements can be used to compare the rates of nucleation between different materials to quantify the probability for seed-based crystal growth versus random crucible site growth. This can be useful for determining expected yield. These measurements can also be used to quantify formation in the unseeded crucibles. By understanding the nucleation rates of metals in unseeded systems, the dimensions can be adjusted accordingly.

FIGS. 5A-5C depict several different seeding configurations, consistent with embodiments of the present disclosure. FIG. 5A shows a seed that is placed on the same surface that the majority of the metal crystal is formed. FIG. 5B shows a seed that is oriented at an angle (tilted) relative to the surface that the majority of the metal crystal is formed. FIG. 5C shows a seed that forms a taper for the metal forming the crystal. These figures show a few examples of different seeding structures and configurations that can be used to control the orientation of crystalline metal (e.g., gold). This can be particularly useful because a number of material properties, ranging from electron work function and dielectric constant to chemical activity, strongly depend on crystal orientation. As such, orientation control can be useful for many applications in near-field optics, hot electron physics, and catalysis. In addition, there are many wet metal etching and growth processes that are facet-selective that can be used in conjunction with crystal orientation control to yield metal structures with desired morphologies.

Different geometries of the seed and their atomic structure can be used to generate single-crystalline metal with various different crystal orientations and morphologies. Experimental tests using the configuration shown in FIG. 5A produce gold crystals with exposed <111>-oriented facets. This process includes forming an insulating layer on the substrate and then forming a seed, as shown by view 532. The metal (e.g., gold) can then be deposited and patterned. A capping layer can then be added to form the crucible, as shown in view 534. The different geometries, in various embodiments, can be caused by roughing the surface of the substrate prior to depositing the metal material and crucible material and/or growth propagation, as further described herein with respect to FIGS. 23A-25B. When a seed is present, roughing the surface of the substrate can physically roughen a surface of the seed.

The platinum seed deposited on the amorphous substrate (e.g., oxide) can result in single-crystalline growth with <111> orientation in the z direction at the gold-platinum interface. Furthermore, this <111>-oriented nucleation and growth process is believed to propagate in the direction perpendicular to the substrate. Based upon this understanding, it is understood that tilting the face of the seed relative to the crucible body can result in a crystal that grows with the <111>-oriented facet at that same angle as the seed, exposing a different crystal facet in the direction perpendicular to the substrate.

There are a number of manners in which the seed can be tilted relative to the major surface of the substrate, such as illustrated by FIG. 5B. For instance, the crucibles can be prepared by first etching a <100>-oriented silicon substrate with KOH, which is an anisotropic etchant which can yield features with 55 degree side walls. The samples can then be thermally oxidized, which forms the bottom oxide layer of the crucible, as shown by view 536. The platinum seed can be deposited on the sidewalls of the patterned substrate and the gold strips can be deposited along either the bottom or top of the etched features, as shown by views 538 and 540, respectively. The metal can then be encapsulated with silicon dioxide, rapid thermal annealed, and allowed to cool in order to form a single-crystal. This can be useful for attempting to orient the <111>-axis at a 55 degree angle relative to the major surface of the substrate and the crystal in the flat section of the crucible.

Consistent with various embodiments, seeds can be designed with a taper, as shown in views 542 and 544 of FIG. 5C. This can be useful for increasing the probability that the metal can nucleate at a singular point corresponding to the end of the taper. By evolving the seed from a one-dimensional sheet to a three-dimensional taper the crystal orientation can be controlled along multiple axes. In certain embodiments, the taper can be created by etching an inverse pyramid in the silicon substrate by anisotropic etch and then thermally oxidizing the wafers, which forms the bottom of the crucible, per view 542. Seed material (e.g., platinum) can then be deposited at the bottom of the pyramid, which forms a nanoscale taper. Next, metal (e.g., gold) strips can be deposited, per view 544. The top crucible oxide can be created and an RMG process can then be carried out to form a single crystal. The use of such a process can be particularly useful for controlling two or three of the crystal orientations. According to embodiments, the size of the inverse pyramid and the length of the platinum taper can be varied.

In a number of specific embodiments, after growing the single-crystalline metal, one or more optional post-processing steps can be performed, such as a wet chemical processing. FIGS. 6A-6D depict aspects relating to the use of refinement of single-crystalline metal structures, consistent with embodiments of the present disclosure. Various embodiments are directed toward the use of wet chemical processes, such as the selective etching or growth of gold, to refine the metal structures discussed herein. The crystalline metal can be particularly well suited for wet chemical processing because these structures do not possess grain boundaries and are not susceptible to uncontrolled chemical reactions at these boundaries. In addition, crystalline structures have well-defined facets and have the potential to support facet-driven chemical processing. Various embodiments are directed toward the combination of lithography and wet chemistry as techniques for controlling the shape, morphology, and position of metallic structures on a substrate. For more general and specific information related to post-processing steps performed on single-crystalline material, reference is made to Sun, Yugang, and Younan Xia. "Shape-controlled synthesis of gold and silver nanoparticles." Science 298.5601 (2002): 2176-2179, and Lee, You-Jin, et al. "Ultrasmooth, highly spherical monocrystalline gold particles for precision plasmonics." ACS nano 7.12 (2013): 11064-11070, which are herein incorporated in their entirety for their specific and general teachings related to deposition of silver onto gold and wet chemical etching as a post processing set, respectively.

According to various embodiments, it is recognized that chloroauric acid can be used to etch crystalline gold octahedral nanoparticles into atomically-smooth gold nanospheres, as shown in FIG. 6A. As the images 647, 648, 649, 651 in FIG. 6B indicate, etching occurred along the edges of the octahedral and favored the removal of gold atoms with relatively low coordination numbers, i.e., few neighboring gold atoms. A statistical TEM analysis 652 of these particles 653, 654, 655, 656, 657, 658 show that wet-etched particles are atomically smooth and are significantly more circular than their traditional polycrystalline counterparts, per FIG. 6C. Etched crystalline particles can serve as seeds for the growth of large crystalline octahedra, as illustrated by 659, with dimensions at the hundreds of nanometer scale, as shown by FIG. 6D. This result indicates that crystalline gold surfaces can serve as atomic-scale templates for the growth of macroscopic crystalline structures, as illustrated by the regrowth 660.

The use of wet chemistry or electropolishing can be useful for reducing or eliminating surface roughness, which can be detrimental to, for example, plasmonic devices because it is a major source of optical scattering. This roughness can take the form of nanometer-scale features due to roughness created by the crucible walls. A variety of approaches can be used to reduce the roughness of the gold structures, such as direct wet etching and electropolishing.

According to some embodiments, a solution of chloroauric acid and Polydiallyldimethylammonium chloride (poly-DADMAC) can be used to wet etch the single-crystalline metal. This etch technique with substrates contains at least two variations from wet etching with colloids. A first difference is that the surface area of the structures on a substrate is orders of magnitude less than the surface area of nanoparticles in solution, which modifies the etching kinetics. A second difference is that liquid fluid flow at a substrate interface can introduce different hydrodynamic effects. Varying the etchant concentration and stirring conditions can therefore be useful for controlling the process results. For example, it is believed that non-agitated etching conditions may be useful for reducing or eliminating inhomogeneous convection currents at the substrate surface, but that periodic agitation may still be required to eliminate ion gradients at the substrate surface. Further refinement to the desired parameters can be determined using atomic force microscopy (AFM) to track surface roughness as a function of time and by using electron diffraction to characterize the post-etched gold crystal orientation.

Various embodiments are directed toward the use of an electrochemical polish. For example, a device can be electrically biased in an electrolyte solution using a potentiostat. To electrically contact all of the gold microstructures on the substrate, devices can be fabricated with a highly branched platinum seed, such that all of the platinum and gold features on the substrate are conductively connected. The form factor, which can comprise a network of microstructures with many exposed edges, can be taken into consideration relative to its impact the electric field distribution upon biasing. Electrochemical etching occurs at areas with large electric field gradients. Accordingly, concentration of the electric fields at the wrong areas can be avoided by control over the form factor. It is recognized that while many electrochemical processes operate under direct current (DC) biasing, pulsed biasing protocols can help minimize ionic accumulation zones that can build up at the substrate surface. The pulsed and DC biasing parameters can be adjusted according to electrochemical regimes that yield smooth gold surfaces.

Certain embodiments of the present disclosure are directed toward the use of single-crystalline metal microstructures as a template for the wet chemical metal growth out of the plane of the substrate. The re-growth of gold octahedral from etched gold spheres is possible, and this indicates that crystalline gold with sharp edges and flat facets can grow from a crystalline seed of arbitrary shape. For instance, a device can be stirring solutions of polyDADMAC, phosphoric acid, and chloroauric acid in ethylene glycol at high temperatures. The growth conditions can be controlled by varying the chemical conditions, tracking and modifying the pH, and setting different temperatures. For example, the growth conditions can be tailored to encourage growth of atomically sharp metal features on substrates. Sharp metal features have great utility in field-enhanced spectroscopy such as Raman spectroscopy and can also be used as tips for hot electron generation. In various examples, the growth conditions can be tailored to encourage atomically flat surfaces. In octahedral growth, the exposed gold boundaries terminate with atomically smooth <111>-oriented facets. Thus, crystal growth with rate-limiting <111>-oriented boundary growth can be used.

Various embodiments are directed toward the use of selective molecular layers on the surface of crystalline metal controlling metal growth at particular locations or facets. Molecular layers of ions and surfactants play major roles in colloidal silver and gold growth because they can selectively catalyze or block crystal growth in crystal orientation-dependent ways. The application of such molecular layers to substrate-based structures can be used to provide atomic-scale control. In various embodiments, a combination of soft lithography with RMG created single-crystalline metal can be used to print patterns of thiolated molecules onto microstructures, such that sections of the microstructures can be thiolated. Gold-sulfur bonds have particularly strong covalent bonds, making them good candidates as a molecular mask material. In addition, alkanethiols are known to self-assemble in tight, angled configurations on <111>-oriented gold, which is the orientation of gold that is exposed after removing the top portion of the crucible, in various embodiments. Gold etching and growth chemical processes can be used to create thiolated and non-thiolated sections, which can be compared using scanning electron microscope (SEM) and AFM. The quality of the molecular mask can be tuned by varying alkane chain lengths. For example, it is believed that longer chain lengths can yield a better physical and electrochemical barrier.

According to embodiments, another metal (e.g., silver) can be selectively deposited (e.g., by selective electrochemical deposition) onto the crystalline gold structures. In colloidal synthesis, monolayers of silver can form at gold interfaces spontaneously in a process known as under-potential deposition (UPD). The UPD process is selective to different crystal facets of gold and can be used, in conjunction with other forms of chemistry, to target gold growth or etching in facet-dependent ways. UPD can also be used to functionalize gold with other metals, like silver, to modify its chemical behavior. Silver is nearly lattice matched with gold, and thus may be capable of highly ordered silver UPD. The device can then be incubated in aqueous solutions of silver bromide to initiate UPD and then gold growth chemistries can be used with these samples. Without being limited by theory, it is believed that the silver can more strongly deposit along and passivate the non-<111> facets than the <111> facets, due to the larger coordination numbers accessible to silver atoms, and that this can bias gold metal growth accordingly. Surface Enhanced Raman Spectroscopy (SERS) studies on crystalline antennas with and without the silver can be used to quantify the SERS magnitude and peak positions.

Figure 7C:
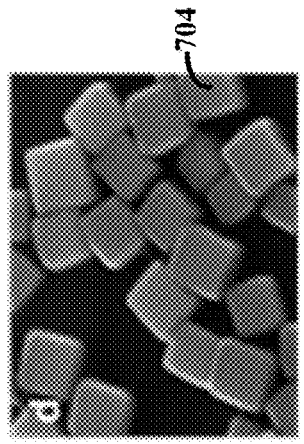
FIGS. 7A-7F depict examples of single-crystalline metal used for optical devices, consistent with embodiments of the present disclosure.
Figure 7D:
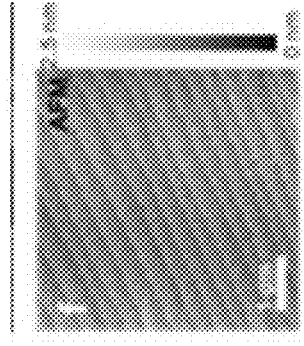
Figure 7E:
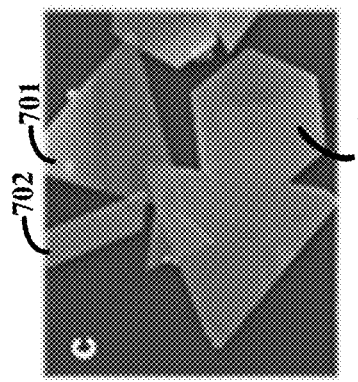
Figure 7F:
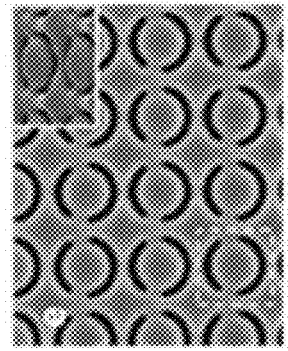
Figure 7A:
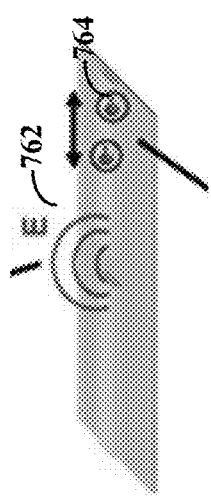

FIGS. 7A-7F depict examples of single-crystalline metal used for optical devices, consistent with embodiments of the present disclosure. Optical systems consisting of nanostructured metallic parts can be used as part of a number of emerging optical and optoelectronic technologies due to their ability to manipulate light in novel and useful ways. For example, fine control of optical responses can be accomplished using plasmonic resonances, which are oscillations of free electrons in metal that couple with the electromagnetic field. FIG. 7A shows an example of near field optics where plasmonic antennas are used to create strongly confined electric fields 762 and electric field gradients. As shown in FIG. 7A, in the near-field, plasmonic structures 764 can be used to amplify local field intensities by many orders of magnitude within nanoscale volumes. These "hot spots" can be used for a variety of applications including, but not limited to, in field-enhanced spectroscopies and non-linear optics. Their large field gradients yield large optical forces.

Figure 7B:
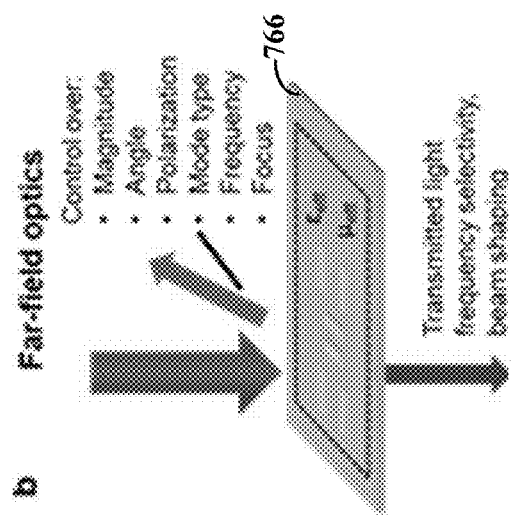

FIG. 7B shows how plasmonic metamaterials 766 support tailored optical responses in the far field. In the far-field, plasmonic metamaterials 766 can be constructed from optical antenna arrays and can control the magnitude, angle, and polarization of light in nearly arbitrary ways (e.g., as shown in FIG. 7B). As a technology, plasmonic systems can be used as sensors and probes in biological imaging and therapeutics, and have been integrated with LEDs, lasers, fibers, detectors, modulators, and solar cells to improve baseline performance and create new device functionality.

It is recognized that optical losses intrinsic to metal optics systems can hamper the function of plasmonic systems. These losses can lead to exponential reductions in metrics such as plasmon propagation length and field-enhancement, thereby impeding the commercial translation of these systems. There exist three principle sources of loss in plasmonic platforms: Ohmic losses due to absorption by metal atoms, plasmon scattering at grain boundaries in the metal films, and plasmon surface scattering due to film surface roughness. As such, various embodiments are directed toward the creation and use of single-crystalline metal structures with atomic scale smoothness. In these systems, plasmons do not scatter at grain boundaries because no such boundaries exist, and surface scattering is suppressed with the elimination of nanoscale surface roughness. Noble metals can be particularly useful because, when compared to all other plasmonic materials, they exhibit low intrinsic Ohmic losses at visible and near-infrared frequencies.

There are variety of different manners in which single-crystalline metal nanostructures can be created. One method involves the growth of the nanostructures in solution in colloidal form, where modern chemical synthesis methods can yield a wide range of crystalline nanostructures 701, 702, 703, 704 including nanowires, nanoplates, nanocubes, and nanospheres (as shown in FIGS. 7C and 7D). Optical experiments on these structures, prepared by random drop-casting onto substrates, reveal good optical properties. However, it has been recognized that their growth and processing in solution can make their ordered integration in solid state platforms difficult, if not impossible.

Another method involves the use of epitaxially grown metal films on a substrate. Single-crystal silver and gold films can be grown on substrates such as mica and lithium fluoride, respectively (as shown in FIG. 7E). While these films also exhibit good optical properties, their requirement of unusual substrates inhibits their integration with conventional electronic chip-scale technologies, which are based on substrates such as silicon. It is noted that low temperature molecular beam epitaxy (MBE) has been developed to grow silver directly on a silicon substrate (FIG. 7F, where the different gray scale illustrates the size scale). It is recognized that this particular technique is highly specialized, extremely slow, and believed to be limited to silver-on-silicon. Silver can also be deposited on <111>-oriented silicon using temperature sputtering (e.g., 200-300 degrees C.), but this process is also believed to be limited to silver-on-silicon and does not generalize to insulating substrates due to its requirement for lattice matching. Metal semiconductor systems are limited in temperature processing, the limitation being dependent on the particular metal. Many of these systems exhibit eutectic behavior which manifests a temperature depression effect.

Accordingly, certain embodiments are directed toward optical systems that are designed to support plasmonic resonances by creating single-crystalline metal structures using an RMG process. This can include a plurality of nanostructured metallic parts that are designed for use with optical and optoelectronic technologies due to their ability to manipulate light in novel and useful ways. The use of metallic structures with small feature sizes allows for fine control of optical responses through the use of plasmonic resonances, which are oscillations of free electrons in metal that couple with the electromagnetic field.

Figures 8B, 8C, 8D:
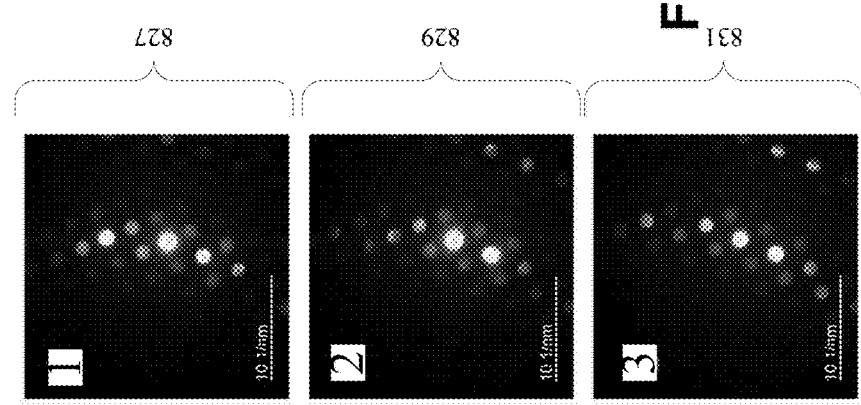
FIGS. 8A-8D depict images of rapid melt growth (RMG)-annealed gold structures, consistent with embodiments of the present disclosure.
Figure 8A:
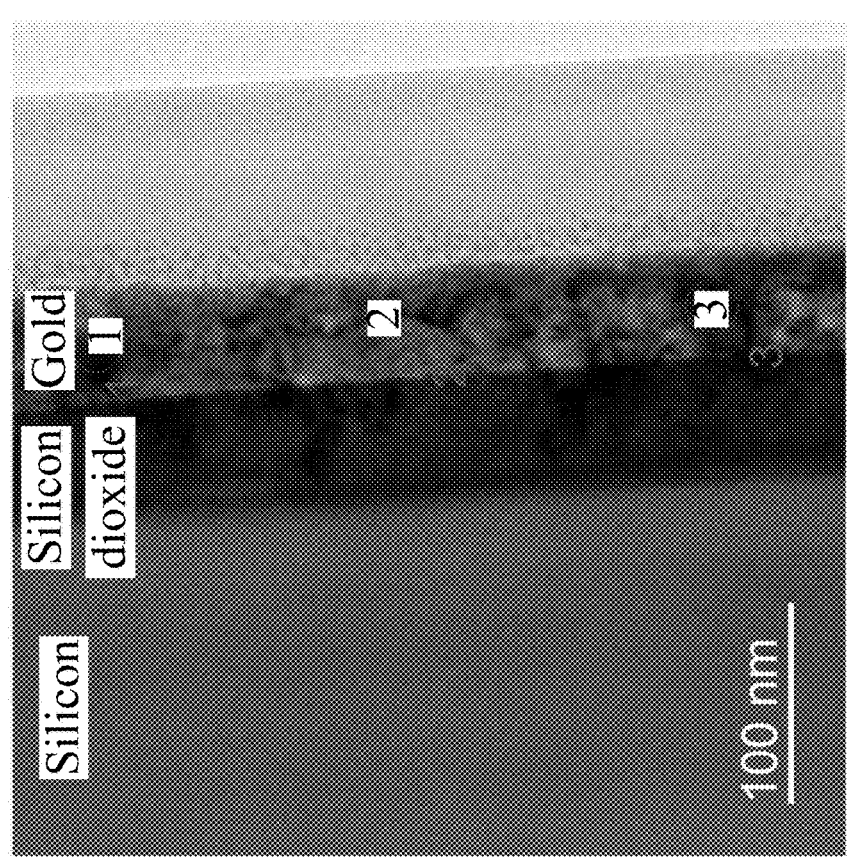
Figure 9A:
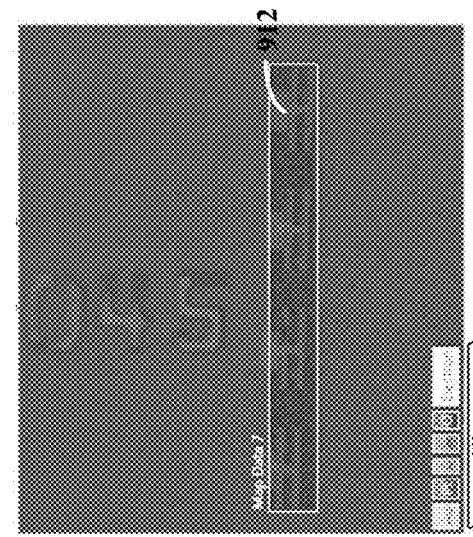
FIGS. 9A-9D depict images of tree-like single-crystalline metal, consistent with embodiments of the present disclosure.
Figure 9B:
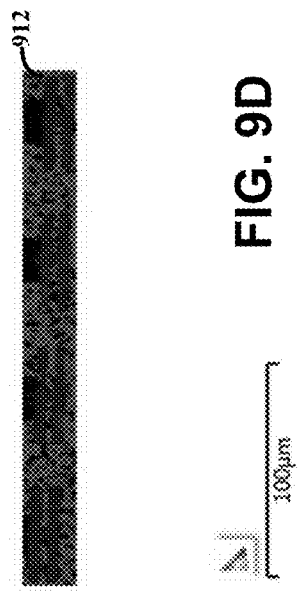
Figure 9C:
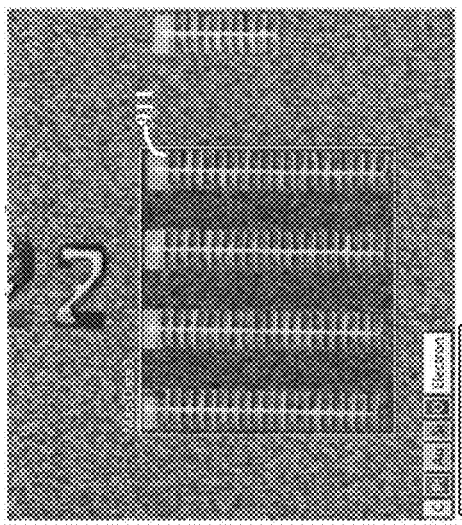
Figure 9D:
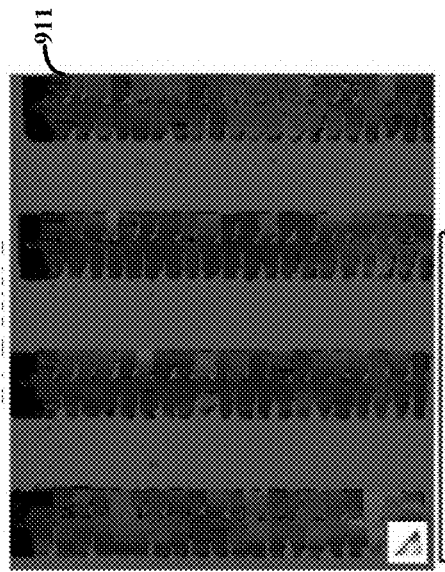

FIGS. 8A-9D depict images of RMG-annealed gold structures, consistent with embodiments of the present disclosure. View 823 of FIG. 8A shows a scanning electron microscope image of a cross sectional cut of RMG-annealed gold prepared by focused ion beam milling. Views 827, 829 and 831 of FIGS. 8B-8D respectively show electron diffraction images from three points in the gold sample (positions marked by numbers 1, 2 and 3, respectively) as measured using a transmission electron microscopy. The observation of clear points in the diffraction images indicate the gold is crystalline at each of the points.

According to embodiments, single-crystalline metal structures can be formed according to a number of different shapes and dimensions. For instance, the structures not limited to a straight line can include curved structures, multiple edges, and varying thicknesses, among other features. FIGS. 9A-9D depict images of tree-like single-crystalline metal structures 910, 912, consistent with embodiments of the present disclosure. The images illustrated by FIGS. 9A and 9C (e.g., the left side) are of single-crystalline gold structures that are 125 µm-long, at two different magnifications. The images illustrated by FIGS. 9B and 9D (e.g., on the right side) are for single-crystalline gold structures 912 that are 20 µm-long, at two different magnifications. The particular structures depicted were processed using an RMG method using seeds, as is consistent with the discussion herein. The upper images are recorded using scanning electron microscopy while the lower images are recorded using electron back-scattering diffraction and show a consistent crystal orientation.

The seeding location is at the top of the tree structure for each of the images. The ability to form a single crystal from this location down through the entire tree structure shows the surprising robustness of the RMG methods discussed herein. This further supports that the depicted tree like structures are merely examples of possible shapes and are not limiting.

FIGS. 10A-10F show images of rectangular single-crystalline metal of different dimensions, consistent with embodiments of the present disclosure. The images show, from FIG. 10A to 10F, rectangular single-crystalline gold strips 1013, 1015, 1017 that are 15 µm-long, 40 µm-long, and 200 µm-long, respectively. These single-crystalline gold rectangular structures 1013, 1015, 1017 were processed using an RMG method using seeds, as is consistent with the discussion herein. The upper images illustrated by FIGS. 10A, 10B, and 10C are recorded using scanning electron microscopy while the lower images illustrated by FIGS. 10D, 10E, and 10F are recorded using electron back-scattering diffraction (with the background grey not including the single crystalline metal) and show a consistent crystal orientation for the metal structures.

Experimental/More Detailed Embodiments

Metallic structures on insulators are beneficial in advanced electronic and nano-optical systems. Their performance correlates with material quality, where single-crystalline metal structures exhibit superior performance compared to their polycrystalline counterparts. Various embodiments include methods for creating patterned single-crystalline metal microstructures on amorphous insulating substrates, using liquid phase epitaxy. For example, the metal can be encapsulated in an insulating crucible, together with a seed of differing material. The system is heated to temperatures above the metal melting point, followed by cooling and metal crystallization. During the heating process, the metal and seed form a solid solution (with a higher melting point than the metal), which directs liquid epitaxy metal growth. Surprisingly, it has been discovered that the metal microstructures crystallize with the <111> direction normal to the plane of the film. Creating the patterned single-crystalline metal on amorphous insulating substrates can be used for the large scale integration of high performance plasmonic and electronic nanosystems.

As previously discussed, in various embodiments, single-crystalline metal structures can be created on insulating substrates via a top-down technique with shapes and positions patterned by lithography. The insulating substrates can be transparent and electrically insulating, such as silicon dioxide, which can be beneficial for a variety of applications and can provide electrical isolation and a low loss, low refractive index background, and can be compatible with a variety of conventional fabrication processes.

The single-crystalline metal structures in various embodiments are created based on liquid phase epitaxy. For example, polycrystalline metal structures which are encapsulated in an amorphous insulating crucible, together with polycrystalline seed structures of differing material, are heated to the liquid phase. As the system cools, the metal solidifies into single crystals. In various experimental embodiments, gold is used as the metal. Gold can be a beneficial material for electronics and plasmonics because of its conductivity and chemical inertness.

FIGS. 11A-11F illustrate example device layouts and fabrication processes in accordance with various embodiments. FIG. 11A for example illustrates the device layout from a top view (on the left) and a side view (on the right). FIG. 11B illustrates an example of a time line of temperature used to perform the liquid phase epitaxy as illustrated by FIG. 11A.

As illustrated by FIG. 11B, a 30 nm-thick polycrystalline seed and 100 nm-thick gold microstructures are sequentially deposited and patterned on a silicon dioxide substrate using conventional lithography and metal deposition methods. The seed material is platinum, which has a higher melting temperature than the metal material (e.g., gold) and forms a single lens binary phase diagram with gold, with a miscibility gap at lower temperatures. A 1 µm-thick layer of silicon dioxide is then deposited to encapsulate the structures in an insulating microcrucible. Next, the substrate is heated to and held at 1080° C. for one second, which is just above the melting point of gold (1064° C.) but below the melting temperature of the platinum seed. Finally, the sample is cooled and the silicon dioxide cap is removed, exposing the metal structures and the underlying silicon substrate. Details of fabrication steps in accordance with various experimental and more detailed embodiments is further described herein. Use of the liquid phase epitaxy is simpler and faster as compared to other techniques, such as the zone-melting recrystallization method, because it operates by heating and cooling the entire wafer at uniform temperatures with no moving parts.

FIGS. 11C-11F show examples of crystal orientation and grain sizes. FIG. 11C illustrates an electron backscatter diffraction (EBSD) image of an area of gold microstrips (e.g., such as particular gold microstrip 1123) with an inset image showing an individual strip 1124. Surprisingly, the orientations of the metal crystals are not random but have the <111> direction perpendicular to the substrate (i.e., along the z-axis in the EBSD images, see coordinate system in FIG. 11D showing a gold microstrip along the z-axis 1125, along the y-axis 1127, and along the x-axis 1129). In the directions along the strip and transverse to the strip (i.e., along the x- and y-axes in the EBSD images), the crystal orientations are random (see, FIGS. 15A-15C). The ESDB image can include a (red) background that arises from the crystallinity of the silicon substrate.

In various specific experimental embodiments, an EBSD analysis of hundreds of gold microstructures with varying aspect ratios and dimensions indicates that microstructures with a broad range of geometries can form into single crystals with high yield. These structures include high aspect ratio strips tens to hundreds of microns in length and branch-like structures, as further illustrated herein. The samples can have <111> directions along the z-axis. In some instances, a process failure in the few devices may not produce single crystals, and which is due primarily to microcrucible warping or failure during sample heating, which can lead to physical disconnect between the gold structure and seed. The process yield can decrease as the microstructures increase in size and the crucibles became more mechanically fragile. In various embodiments, a higher overall yield can be obtained by using thicker and stiffer microcrucibles.

FIG. 11D shows an EBSD image of a representative processed gold microstrip and a single crystal in accordance with various experimental embodiments. The EBSD image shows the gold microstrip along the z-axis 1125, along the y-axis 1127, and along the x-axis 1129. The seed region, defined by the area of overlapping gold and platinum, is polycrystalline with a (111) fiber texture. The EBSD images can include slight color (e.g., illustrated by the grey scale variation) variation of the gold microstrip, indicative of some minor variations in orientation.

FIGS. 11E-11F show EBSD analysis on two control samples, in accordance with various experimental embodiments. FIG. 11E shows an EBSD image of an as-deposited gold-strip without encapsulation or annealing. These images display a speckled white pattern 1131, 1133, 1135 along the x axis, the y axis, and z axis, indicating the gold is polycrystalline with grains on the order of hundreds of nanometers in size. Interestingly, the grains are all oriented with <111> directions normal to the plane of the film, which is consistent with the <111> fiber textures of vapor-deposited FCC metal films on glass substrate. FIG. 11F shows an EBSD image of a processed gold sample with platinum seed along the z-axis 1137, along the y-axis 1139, and along the x-axis 1141. These images indicate that the gold is polycrystalline with grain sizes on the order of microns. The grains have random orientations, indicating that during processing, the liquid gold crystallized with multiple random nucleation points and crystal orientations upon system cooling. The experiment embodiments indicate that the platinum seed is beneficial to producing single-crystalline gold structures.

Figure 12A:
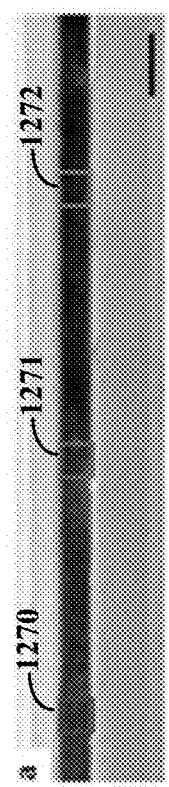
Figure 12D:
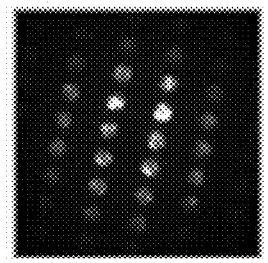
Figure 12C:
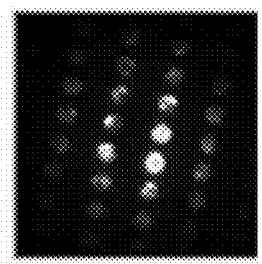
Figure 12B:
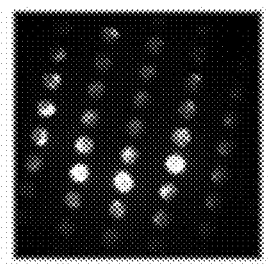

FIG. 12A-12F illustrate experiment results of analyzing the resulting devices with atomic resolution using transmission electron microscopy (TEM). FIG. 12A illustrates a TEM cross-sectional image of a gold microstrip section, with the top section of the oxide crucible etched away. The image shows that the 2.4 µm-long film section possesses constant thickness and smooth sidewalls at the gold-silicon dioxide and gold-air interfaces 1270, 1271, 1272. FIGS. 12B-12D show images of diffraction patterns (e.g., illustrated by the white dots along the black background) from three different sections of the strip that all show the same pattern and orientation, confirming that the sample is an FCC single crystal. The non-uniform brightness within the diffraction spots is due to standard dynamical scattering effects.

FIGS. 12E-12F show images of the gold strip illustrated by FIG. 12A at each of the gold-silicon dioxide and gold-air interfaces (e.g., FIG. 12E corresponds to the gold-silicon dioxide interface and 12F corresponds to the gold-air interface of FIG. 12A). The images of FIGS. 12E-12F show lattice fringes oriented along the length of the crucible, which represent <111> planes. In specific embodiments, the spacing between fringes is measured to be 0.235 nm, which matches the expected spacing between <111> planes in the FCC gold lattice with a lattice parameter of 0.407 nm.

Figure 13A:
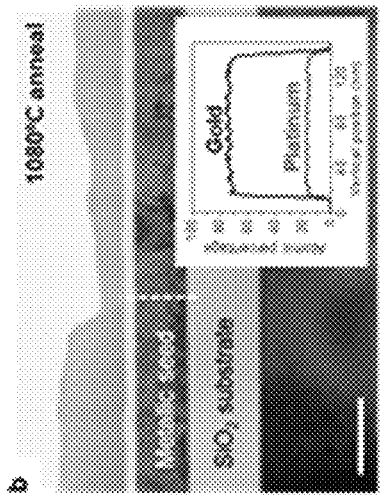

FIGS. 13A-13G illustrate various experimental results of devices generated in accordance with the embodiments described herein. FIG. 13A illustrates a platinum-gold binary phase diagram. According to the platinum-gold binary phase diagram, one of skill may expect that as the temperature is raised to 1080° C., the equilibrium state of the crucible contents can be a liquid platinum-gold solution with no solid seed region. In accordance with various specific embodiments, the gold-platinum structure forms a solid seed that mediates liquid epitaxial growth as the device is annealed. The solid seed exists once the structures are heated to (or above) the gold melting point. The total material composition within the microcrucibles, including the seed and the entire strip regions, range from 98% to 99% plus gold by volume, with the remainder platinum.

Figure 13B:
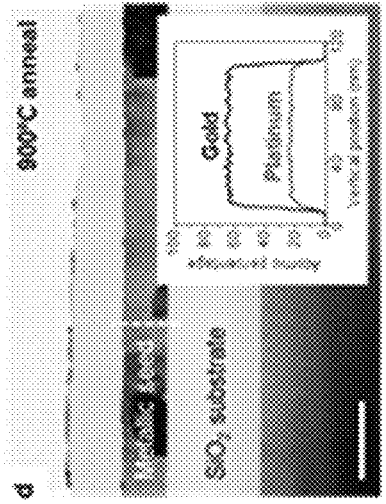

FIG. 13B illustrates a TEM cross-sectional imaging to investigate the material properties of the post-annealed seed region in accordance with an experimental embodiment. The TEM image illustrates that the gold and platinum layers, which are separate layers prior to annealing, form a gold-platinum solid solution after annealing. An elemental map, illustrated by the inset of FIG. 13B, constructed using energy dispersive spectroscopy (EDS), shows that gold and platinum are distributed uniformly across the width of the cross-section. Furthermore, the solid solution has a Pt0.23Au0.77 composition, which contains mass fractions of gold and platinum that are approximately those of the metals in the seed region prior to annealing. It is believed that as the sample is heated, the gold and platinum undergo solid state inter-diffusion. This gold-platinum alloy can remain a solid throughout the annealing process because it has a higher melting point than the maximum annealing temperature (1080° C.), as visualized in the gold-platinum phase diagram of FIG. 13B.

Figure 13C:
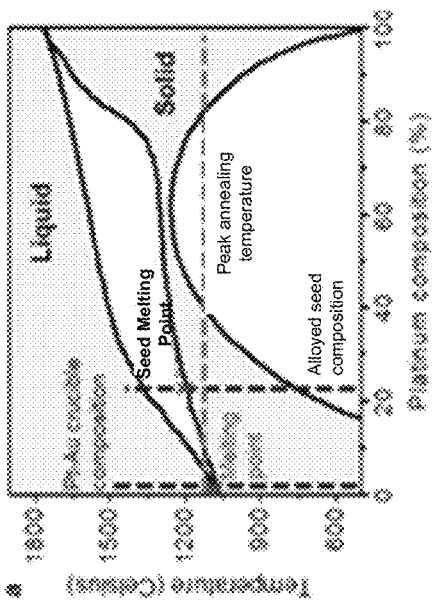
Figure 13D:
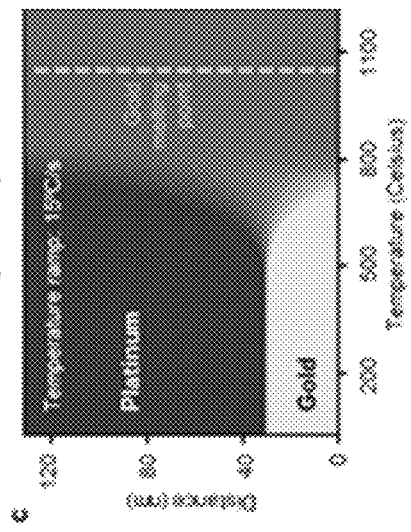

FIGS. 13C-13D illustrate TEM cross-sectional images and EDS maps to investigate the material properties of the post-annealed seed region in accordance with experimental embodiments. In various experimental embodiments, an examination of the solid state diffusion process indicates that the uniform gold-platinum seed structure forms at relatively low temperatures. To quantify metal interdiffusion, a partial differential equation model can be used, which is further described herein. The model accounts for the 15° C. per second rate of heating and captures the non-equilibrium diffusion dynamics of the system. The cross-sectional material profile within the seed as a function of temperature is plotted in FIG. 13C and displays spatially separate gold and platinum regions at low temperatures. Near 500° C., metal diffusion across the gold-platinum boundary becomes noticeable, and by 800° C., the two metal types have completely interdiffused, forming a Pt0.23Au0.77 alloy. As such, the solid seed alloy forms below the melting point of gold. These results are corroborated in experiments where 80 nm-thick gold and 30 nm-thick platinum seed structures are heated to 900° C., well below the gold melting point. FIG. 13D illustrates TEM cross-sectional images and EDS maps of these post-annealed structures that reveal a uniform alloy, with a stoichiometry similar to that of the pre-annealed seed region composition.

FIGS. 13E-13G show EBSD images of the seed region (e.g., illustrated by the arrow) in z (FIG. 13E), y (FIG. 13F), and x (FIG. 13G) axes. In specific experimental embodiments, the post-annealed gold-platinum seeds have grains with well-defined crystal orientations. The EBSD images, shown by FIGS. 13E-13G, of the seed region show that the seed is polycrystalline, and that its grains have <111> directions perpendicular to the substrate. In the plane of the substrate, the grain orientations can be random. The source for such orientation alignment can be traced back to the crystallinity of the seed region, as deposited by electron beam evaporation, which possess a <111> fiber texture (e.g., further illustrated by FIG. 11E). As the seed is annealed and the metal atoms interdiffuse, the <111> crystal orientation can be preserved because the seed remains a solid throughout the process.

Individual grains in the seed region mediate the growth of single-crystalline gold strips. The EBSD images of the gold-platinum seed region in FIGS. 13E-13G show that liquid epitaxy gold growth originates from a single grain in the seed region (white arrows). The crystal orientation of the gold strip is determined by the orientation of that grain. The gold strip is oriented with the <111> direction along the z-axis because (all of) the grains in the seed region possess this crystal orientation. Along the x- and y-axes, the orientation of the gold strip is random because the grains in the seed region have random orientation along these axes (e.g., as illustrated by FIGS. 20A-20D below). In specific embodiments in which the systems have wider widths, multiple competing crystal growth processes can be visualized at the boundary of the seed region and gold strip (e.g., as illustrated by FIGS. 21A-21D below), further indicating that gold epitaxy growth originates from grains in the seed region.

Gold epitaxy can occur at the gold-seed interface due to the low interfacial energy between gold and the seed grains. In specific experimental embodiments, this low interfacial energy arises because gold and platinum both have FCC lattices, have similar bond lengths with a 4% mismatch, and have thermodynamic interactions specified by a single lens binary phase diagram. As such, the kinetics for epitaxy growth at the seed are much faster than those of competing events, such as the nucleation of gold crystals at the walls of the crucible. Specific experimental embodiments include prepared samples consisting of a gold strip and palladium seed. Gold and palladium can have FCC lattices and possess a single lens binary phase diagram. These samples can produce single crystal gold strips upon processing (e.g., as illustrated by FIGS. 21A-21D below). Various experimental embodiments, as described below, include processing a gold strip and platinum seed in an insulating silicon nitride crucible (e.g., as illustrated by FIGS. 22A-22B below).

Figure 14:
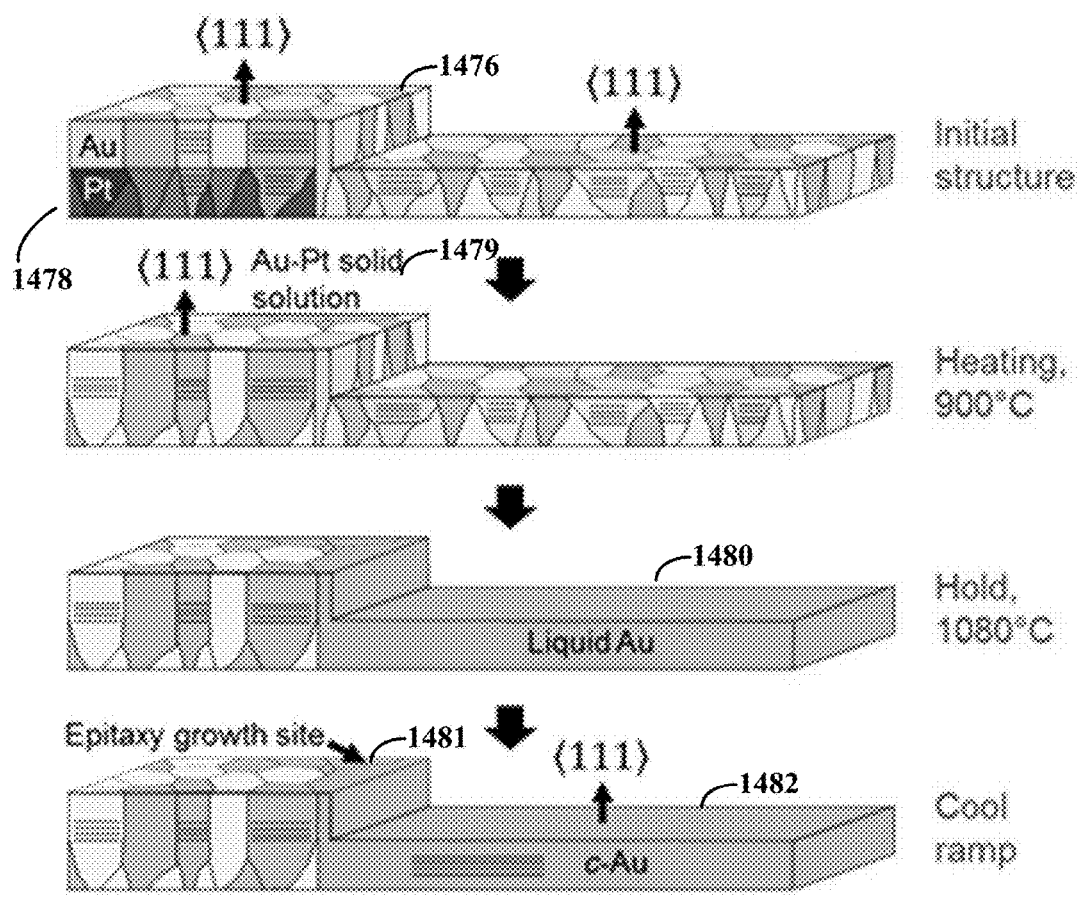
FIG. 14 illustrates an example process for creating single crystal metal on a substrate, consistent with embodiments of the present disclosure.

FIG. 14 illustrates an example process for creating single-crystalline metal on a substrate in accordance with various embodiments. As illustrated, an initial structure of metal 1476 (e.g., gold (Au)) with seeded material 1478 (e.g., platinum (Pt)) is created. The initial structure is heated, such as to 900 degrees C. As the structure is heated, the high melting point seed 1479 forms prior to the melting point of the metal. For example, a gold-platinum solid solution forms prior to the melting point of gold. As the gold melts and then cools, the gold-platinum grains serve as sites for gold growth at an epitaxy growth site 1481. The structure is heated to the melting point of the metal material, resulting in the metal 1480 in the strip liquefying. Once liquid epitaxy initiates at the seed region, a growth front propagates rapidly through the crucible. In specific embodiments, upon cooling, one of the grains in the gold-platinum solid solution serves as a site for liquid phase epitaxy and initiates single-crystalline gold growth (e.g., the epitaxy growth site 1481 initiates the growth of the single-crystalline gold 1482). This concept can be generalized to the single crystal processing of metals beyond gold. A principle criterion is to select metal and seed material pairs that form high melting temperature solid solution seeds that can direct liquid epitaxy growth. While the choice of compatible metal and seed materials is beneficial, other factors, such as the volumetric expansion of the metal and crucible during processing and the chemical reactivity of the metals, can be varied.

Accordingly, various specific embodiments include processing metal structures on amorphous insulating substrates into oriented single crystals. Such methods are compatible with standard fabrication processes, including lithography and damascene patterning, making it a practical route towards large area wafer-scale devices. Further, such result devices can be integrated in electronic and plasmonic systems that operate at the material performance limits of metals.

Various more detailed and/or experimental embodiments include methods of fabricating devices as described herein. In specific embodiments, the substrate is a single crystal p-type silicon substrate. The bottom layer of the microcrucible can be prepared by growing one of two types of thin films on the silicon substrate: thermal oxide layers are grown at 950° C. and LPCVD Si3N4 layers can be grown at 800° C. The thicknesses of these films can be varied from 50 nm to 200 nm.

Further, in specific embodiments, following preparation of the microcrucible, seed and strip layers are patterned. Conventional photolithography with a 1 µm-thick positive photoresist can be performed to pattern the seed, and a 30 nm-thick platinum or palladium metal film can be deposited using electron beam evaporation. The sample can be soaked in acetone for metal lift-off. A second lithography step is used for gold strip patterning. After photoresist development, a 100 nm-thick gold metal film can be deposited using electron beam evaporation, followed by soaking in acetone for metal lift-off. In specific experimental embodiments, the gold strips have lengths ranging from 10 µm to 200 µm and widths ranging from 4 µm to 40 µm. The seeds can be 10 µm-long, and each seed is 6 µm wider than its associated strip. The strips overlapped length-wise with the seeds by 3 µm.

Following metal deposition, a 1 µm-thick LPCVD SiO2 layer, grown at 300° C., is deposited on the sample surface to serve as the top layer of the microcrucible. Heating can be performed using rapid thermal annealing. The temperatures in the furnace can be calibrated using a pyrometer. The samples are heated with a ramp rate up of 15° C./s to 1080° C., held for one second, and then cooled with a ramp rate of 15° C./s using a single temperature gradient profile across the respective samples. The ramp rates are set by controlling the intensity of the lamp heater. After annealing, the SiO2 capping layer can be removed through dry plasma etching.

In various specific embodiments, a partial differential equation can be used to describe the interdiffusion behavior between metal and the seed material. For example, the solid state diffusion between gold and platinum occurs at the seed region where gold stripe overlaps with the platinum seed during the RMG heating cycle. The solid state interdiffusion of gold and platinum is significant enough that the seed region can become a uniform platinum-x-gold-x alloy before melting begins. Gold and platinum are mutually soluble but chemically different. The partial differential equation describing this interdiffusion behavior includes, for example:

$$\frac{\partial x_{Pt}}{\partial t} = \frac{\partial}{\partial z}\left[(x_{Au}D_{Pt} + x_{Pt}D_{Au})\frac{\partial x_{Pt}}{\partial z}\right]$$

where $x_{Pt}$ is the fraction of platinum material in the system, $x_{Au}$ is the fraction of gold material in the system, z is the distance from the bottom of the seed, $D_{Pt}$ is the diffusivity of platinum material in pure gold material and $D_{Au}$ is the diffusivity of gold material in pure platinum material. Since the system consists of (only) platinum and gold, the fractions relate as:

$$x_{Au} = 1 - x_{Pt}.$$

Therefore, the partial differential equation can be expressed as:

$$\frac{\partial x_{Pt}}{\partial t} = (D_{Au} - D_{Pt})\left(\frac{\partial x_{Pt}}{\partial z}\right)^2 + (D_{Pt} + x_{Pt} \cdot (D_{Au} - D_{Pt}))\frac{\partial^2 x_{Pt}}{\partial z^2}.$$

At time zero, the stripe material and seed material have not mixed. The initial conditions are:

$$x_{Pt}(0, z) = \begin{cases} 1 & 0 < z \le seed_H \\ 0 & seed_H < z \le seed_H + stripe_H \end{cases}$$

where $stripe_H$ is the total thickness of the gold-platinum seed and $seed_H$ is the thickness of the platinum seed. At any point during the annealing process, there may be no flux of material diffusing through the bottom of the seed nor the top of the stripe. The boundary conditions are expressed by:

$$(D_A + (D_B - D_A) \cdot x_A(t, 0))\frac{\partial x_A(t, 0)}{\partial z} = 0$$
$$(D_A + (D_B - D_A) \cdot x_A(t, stripe_H + seed_H))$$
$$\frac{\partial x_A(t, stripe_H + seed_H)}{\partial z} = 0.$$

To solve the partial differential equation, a PDE solver can be used in Matlab. The temperature ramp rate is 15° C./s.

Figure 15A:
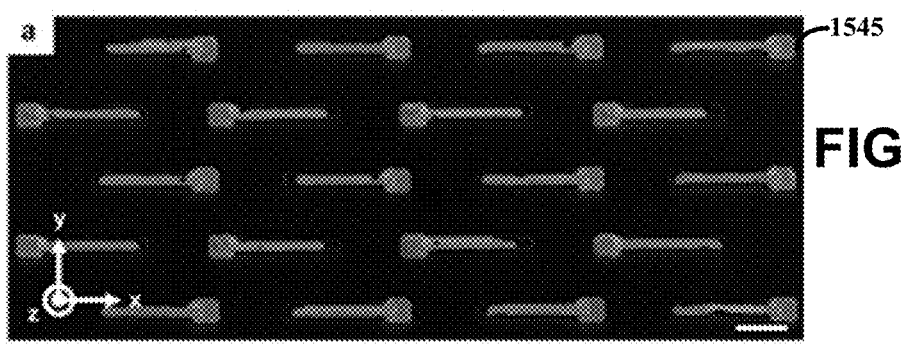
FIGS. 15A-15C illustrate experimental results including SEM images of the devices, consistent with embodiments of the present disclosure.
Figure 15B:
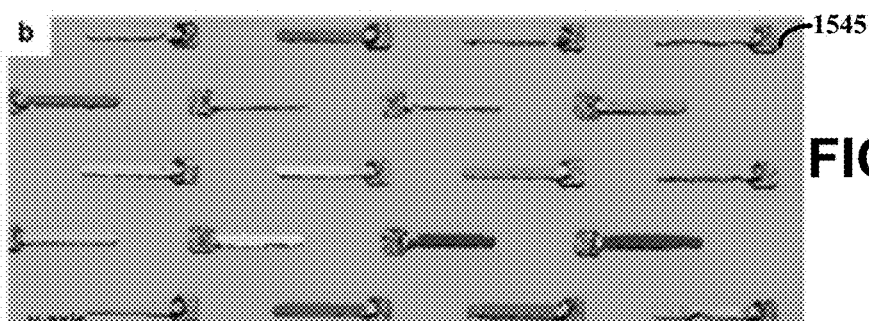
Figure 15C:
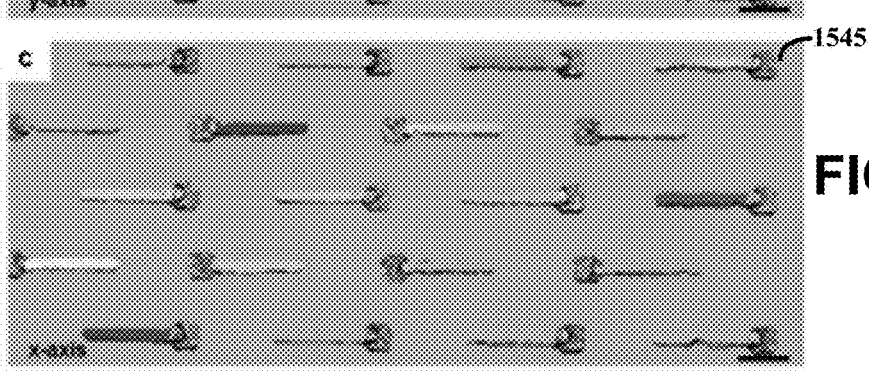

FIGS. 15A-15C illustrate experimental results that include SEM images of the devices. FIG. 15A illustrates an SEM image of the gold microstrips from FIG. 11C (as illustrated by the particular gold microstrip 1545). The coordinate system represents the EBSD orientation axes. FIG. 15B and FIG. 15C illustrate the y-axis and x-axis, respectively, of EBSD images of the strips from FIG. 11C with a scale bar of 20 um.

Figure 16C:
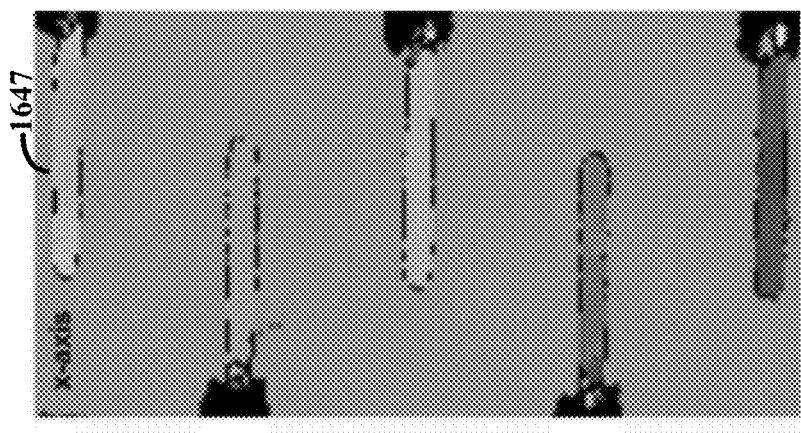
FIGS. 16A-16C illustrate EBSD images of processed 4×30 um gold microstrips with a platinum seed, consistent with embodiments of the present disclosure.
Figure 16B:
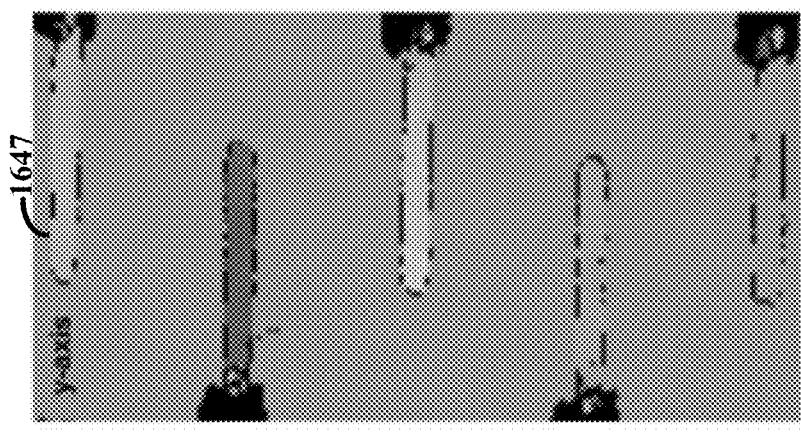
Figure 16A:
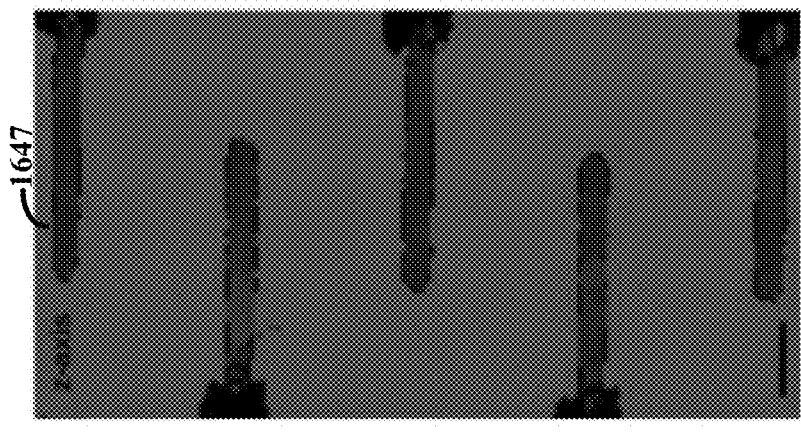

FIGS. 16A-16C illustrate EBSD images of processed 4×30 um gold microstrips with a platinum seed. The scale bar includes 10 um. For example, FIG. 16A illustrates the z-axis, FIG. 16B illustrates the y-axis, and FIG. 16C illustrates the x-axis (as illustrated by the particular gold microstrip 1647).

Figures 17A, 17B, 17C:
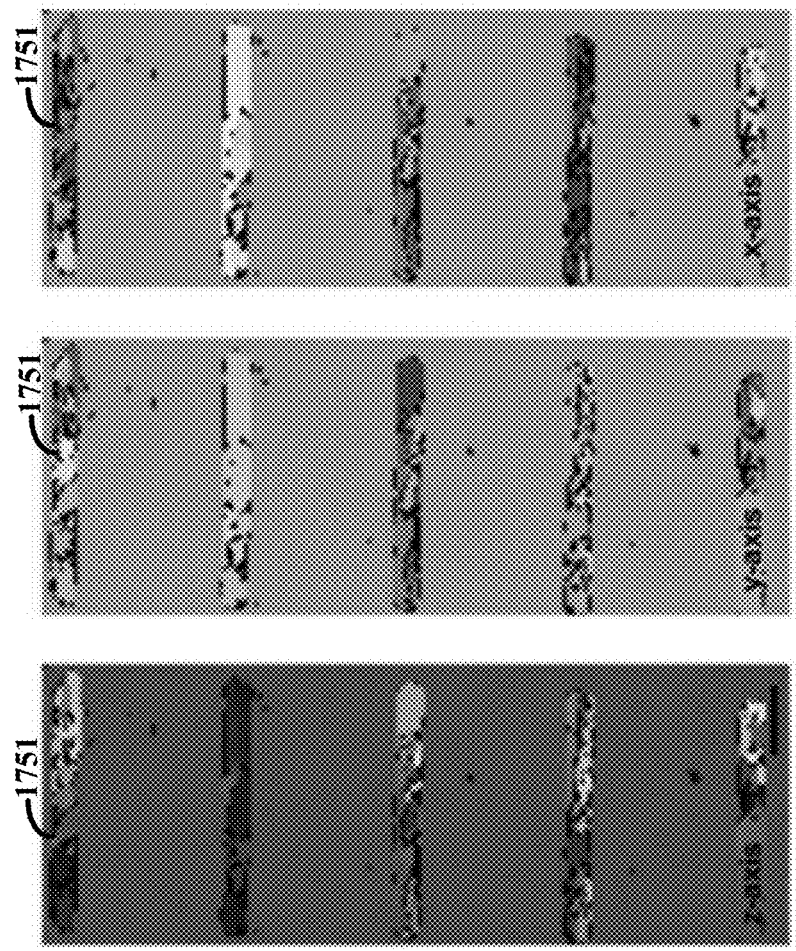
FIGS. 17A-17C illustrate EBSD images of processed 4×30 um gold microstrips without a platinum seed, consistent with embodiments of the present disclosure.

FIGS. 17A-17C illustrate EBSD images of processed 4×30 um gold microstrips without a platinum seed. The scale bar includes 10 um. For example, FIG. 17A illustrates the z-axis, FIG. 17B illustrates the y-axis, and FIG. 17C illustrates the x-axis (as illustrated by the particular gold microstrip 1751).

FIGS. 18A-18D illustrate EBSD images of gold microstrips of varying dimensions with a platinum seed. The scale bar includes 5 um. For example, FIG. 18A illustrates the x, y, and z axes of 20×4 um gold microstrips (as illustrated by the particular gold microstrip shown respectively in an x-axis 1852, y-axis 1853, and x-axis 1854). FIG. 18B illustrates the x, y, and z axes of 40×4 um gold microstrips (as illustrated by the particular gold microstrip shown respectively in an x-axis 1855, y-axis 1856, and x-axis 1857). FIG. 18C illustrates the x, y, and z axes of 80×4 um gold microstrips (as illustrated by the particular gold microstrip shown respectively in an x-axis 1858, y-axis 1859, and x-axis 1860). And, FIG. 18D illustrates the x, y, and z axes of 200×4 um gold microstrips (as illustrated by the particular gold microstrip shown respectively in an x 1861, y 1862, and x 1863 axes).

FIGS. 19A-19C illustrate EBSD images of tree-like gold microstructures with a platinum seed. The scale bar includes 20 um. For example, FIG. 19A illustrates the z-axis, FIG. 19B illustrates the y-axis, and FIG. 19C illustrates the x-axis (e.g., as illustrated by particular gold microstructure 1962).

Figure 20A:
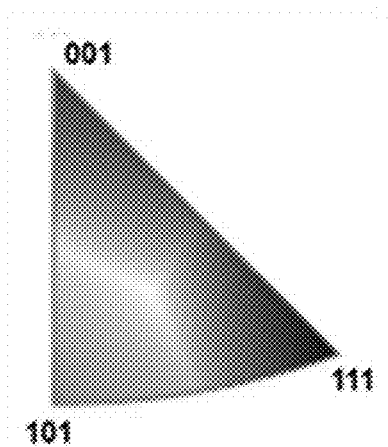
FIGS. 20A-20B illustrate distribution of crystal orientations of processed gold strips, compiled from EBSD data of the structures illustrated by FIG. 12C, and consistent with embodiments of the present disclosure.
Figure 20B:
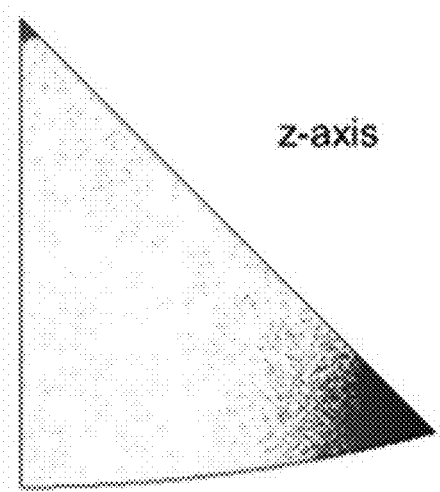
Figure 20C:
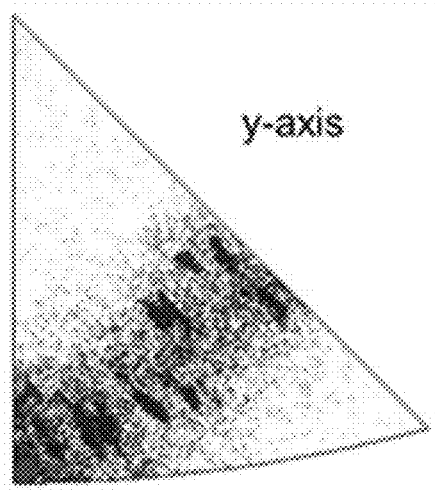
FIGS. 20C-20D illustrate distribution and range of crystal orientations of processed gold strips along the x- and y-axes, consistent with embodiments of the present disclosure.
Figure 20D:
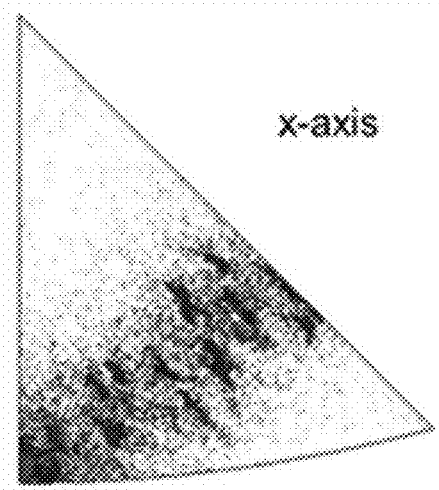

FIGS. 20A-20B illustrate distribution of crystal orientations of processed gold strips, compiled from EBSD data of the structures previously illustrated by FIG. 11C. FIG. 20A illustrates the points superimposed on the map that describe the orientations of the normal crystal planes. FIG. 20B illustrates that along the z-axis, the strips have crystal orientations that are predominantly in the <111> direction. FIGS. 20C and 20D illustrate that along the x- and y-axes, respectively, the strips have a range of crystal orientations. The distribution of crystal orientations along these axes are similar, indicating that the crystal orientations within the planes of the strips are random. The cluster of points in each plot can be from the underlying silicon substrate.

Figure 21A:
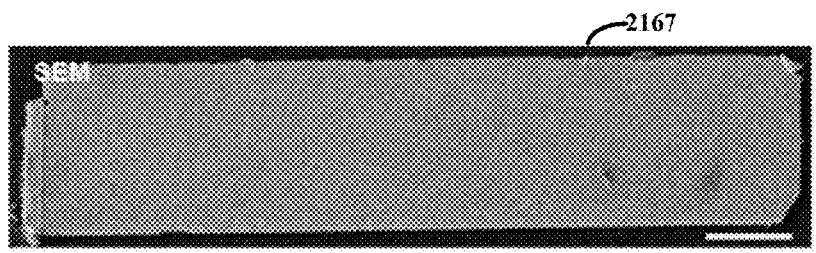
FIGS. 21A-21D illustrate SEM and EBSD images of a 40×200 um gold microstrip with a palladium seed, consistent with embodiments of the present disclosure.
Figure 21B:
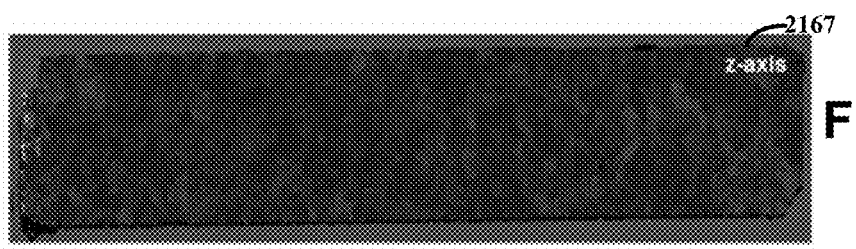
Figure 21C:
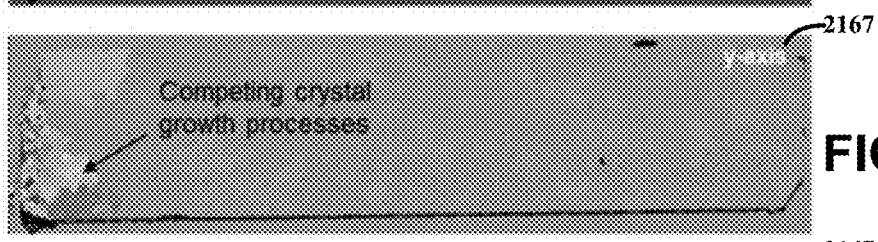
Figure 21D:
Figures 22A, 22B, 22C:
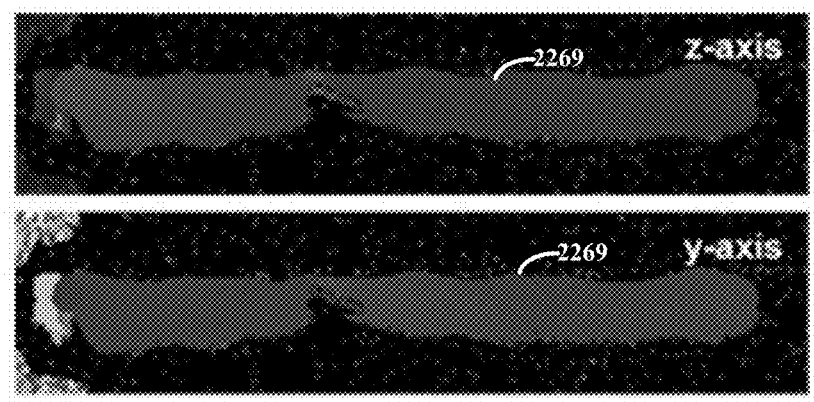
FIGS. 22A-22C illustrate EBSD images of a gold microstrip with a platinum seed, encapsulated in a silicon nitride crucible, consistent with embodiments of the present disclosure.
Figure 23A:
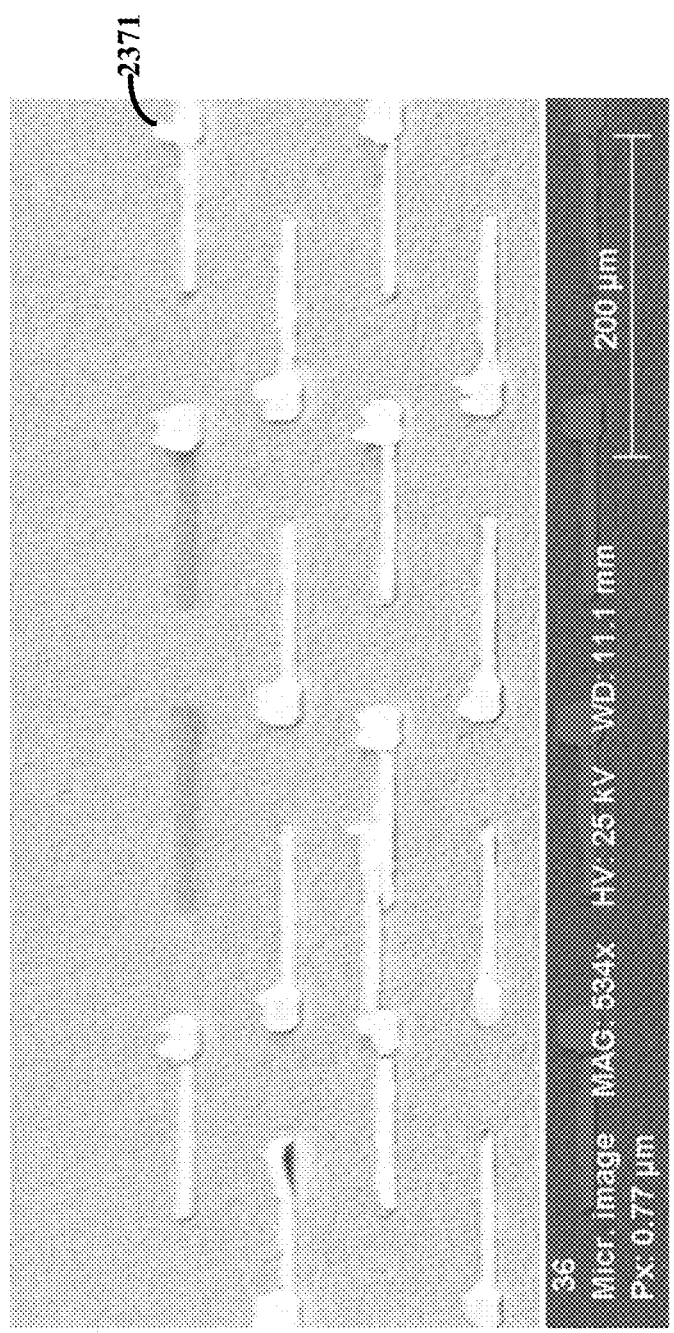
FIGS. 23A-23B illustrate an example of resulting single-crystalline metal grown on a substrate that has a roughened surface, consistent with embodiments of the present disclosure.
Figure 23B:
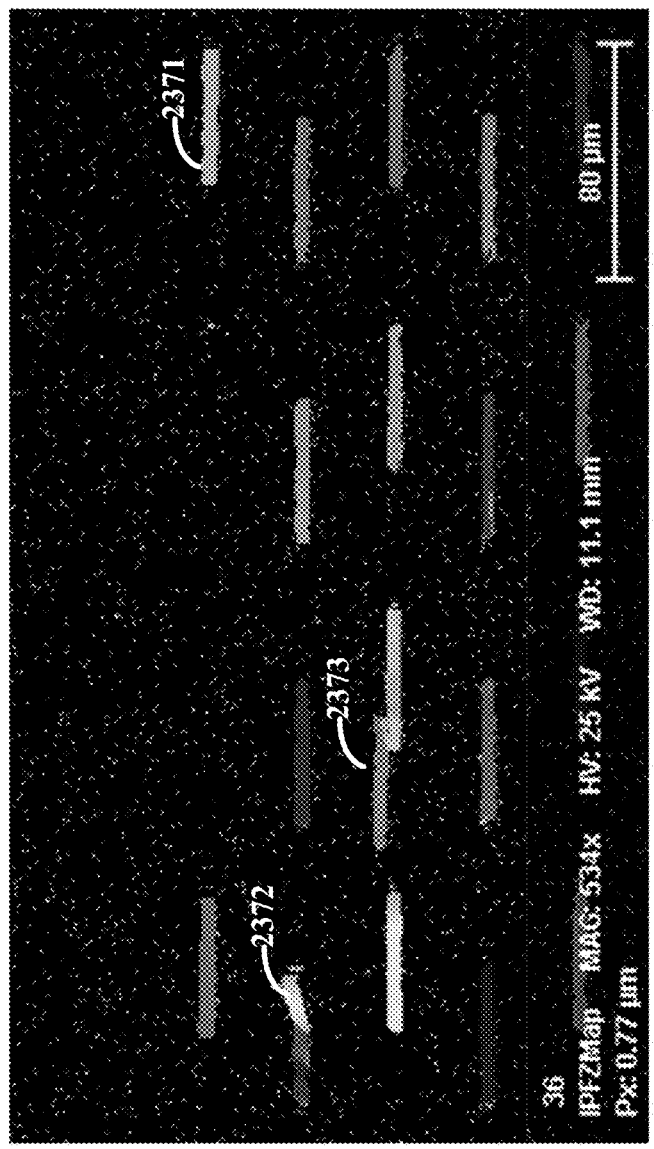
Figure 24A:
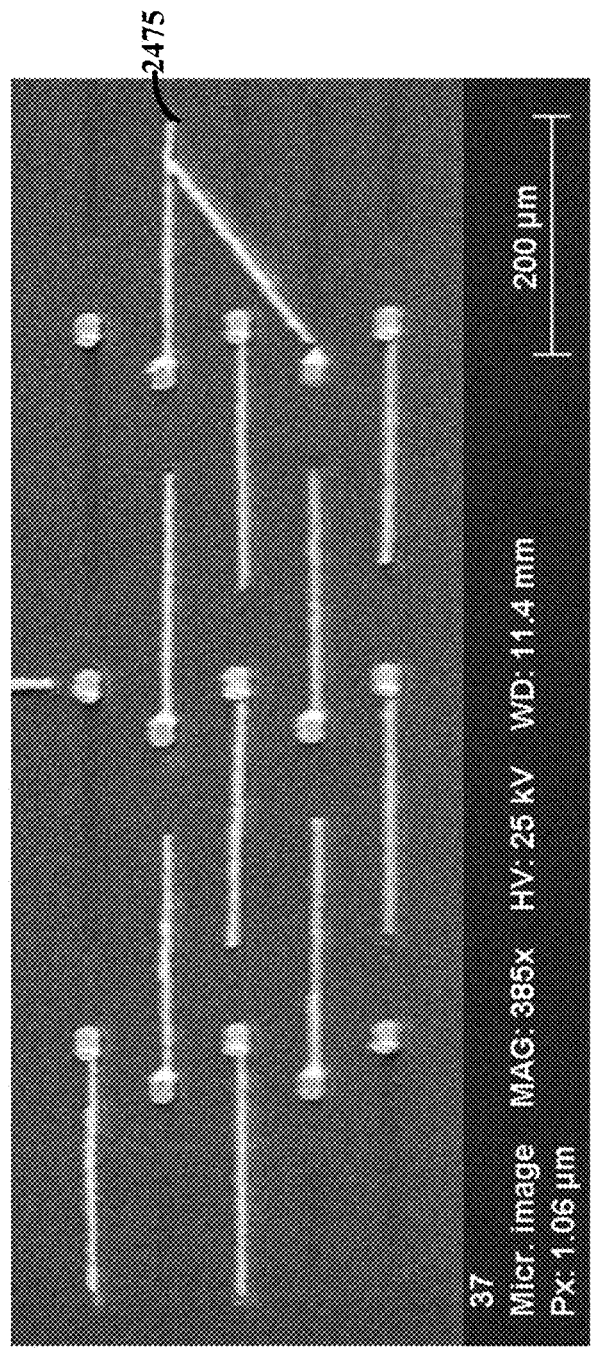
FIGS. 24A-24B illustrate an example of resulting single-crystalline metal grown on a substrate that has a roughened surface, consistent with embodiments of the present disclosure.
Figure 24B:
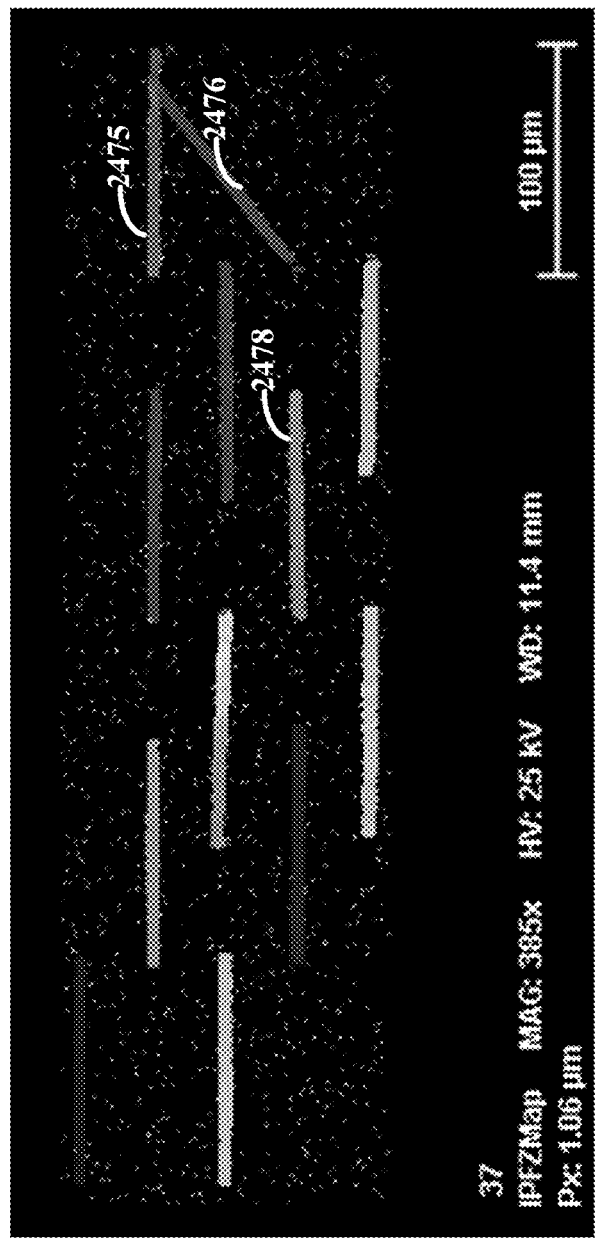

FIGS. 21A-21D illustrate SEM and EBSD images of a 40×200 um gold microstrip with a palladium seed. For example, FIG. 21A includes an SEM image of the gold microstrip 2167. FIGS. 21B-21D illustrate EBSD images in the x, y, and x axes, respectively. The scale bar is 20 um. Multiple crystal growth processes, initiated at the boundary of the seed region and gold strip 2167, can be visualized as illustrated. The growth rates of these competing crystallization processes differ, and the crystal with the fastest growth rate wins out and produces the single-crystalline gold structure.

FIGS. 22A-22C illustrate EBSD images of a gold microstrip 2269 with a platinum seed, encapsulated in a silicon nitride crucible (e.g., illustrated by the darker background). FIG. 22A illustrates the z-axis, FIG. 22B illustrates the y-axis, and FIG. 22C illustrates the x-axis. The scale bar is 10 um.

In various embodiments, the surface (e.g., operative surface) of the substrate can be roughened prior to depositing the metal material and propagating crystal growth. The crystal orientations of the metal strips processed on smooth substrates and/or substrates that have not been roughened have <111> orientation along the axis perpendicular to the substrate (i.e., z-axis). These crystal orientations can be modified when the underlying substrate is textured, sometimes herein referred to as "roughing" or "roughened", prior to the deposition of metal material. Roughing the surface of the substrate can result in physically roughing a surface of the seed material. Surprisingly, it has been discovered that the resulting single-crystalline metal that is grown on the roughened substrate have random crystal orientations in the z direction (e.g., not <111> orientation). The resulting single-crystalline metals with random crystal orientations in the z direction can have different catalytic, electrical, and optical properties than single-crystalline metals having <111> orientations in the z direction. The roughened surface of the substrate can be on an order of the grain size.

FIGS. 23A-23B and FIGS. 24A-24B illustrate examples of resulting single-crystalline metal grown on a substrate that has a roughened surface, in accordance with an experimental embodiment. Specifically, FIGS. 23A-23B and FIGS. 24A-24B show EBSD images of post-annealed gold strips with a platinum seed on a substrate with 10 nm RMS roughness. The metal structures of FIGS. 23A-23B have dimensions of 2 um×40 um (e.g., illustrated by the particular metal structure 2371) and the metal structures of FIG. 24A-24B can have dimensions of 2 um×80 um (e.g., illustrated by the particular metal structure 2475). The gold strips are single-crystalline, and possess crystal orientations along the z-axis that are random. It is believed that the non-random texturing of the seed region can direct the formation of single crystal metal strips with further control over crystal orientation (e.g., illustrated by the different orientations of the metal structures 2371, 2372, 2373 of FIG. 23B and 2475, 2476, and 2478 of FIG. 24B). Control over metal crystal orientation is beneficial for many applications, including catalysis, photocatalysis, optoelectronic devices based on hot electron dynamics, and electronics.

Figure 25A:
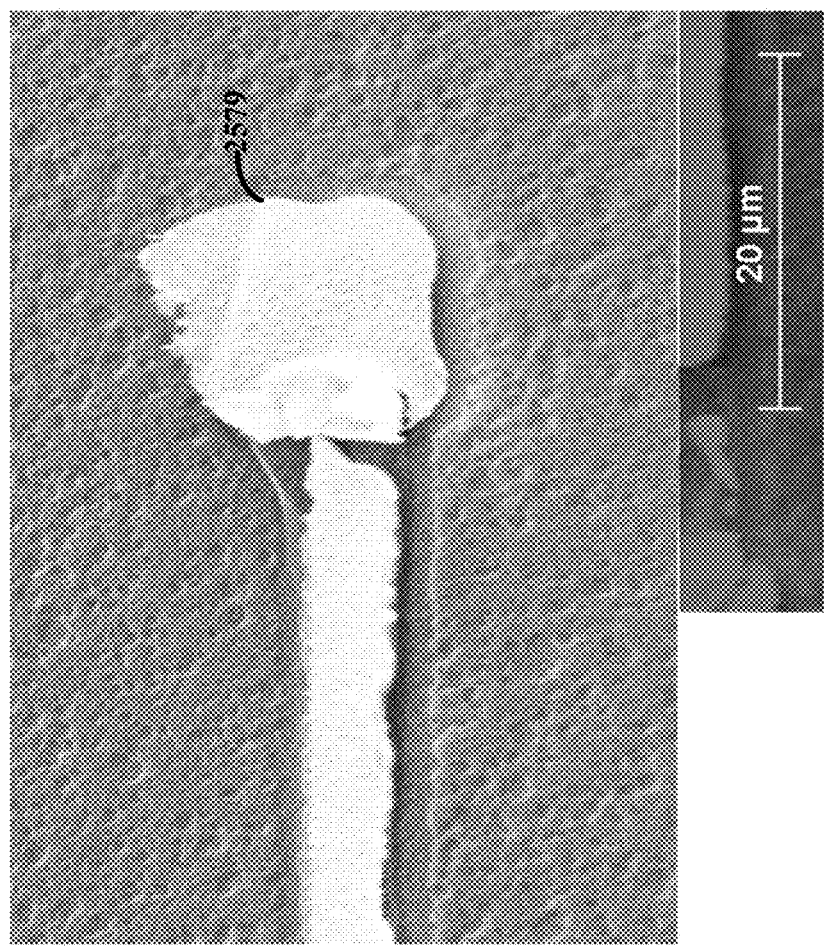
FIGS. 25A-25B illustrate an example of resulting single-crystalline metal grown on a substrate that has a roughened surface, in accordance with an experimental embodiment.
Figure 25B:
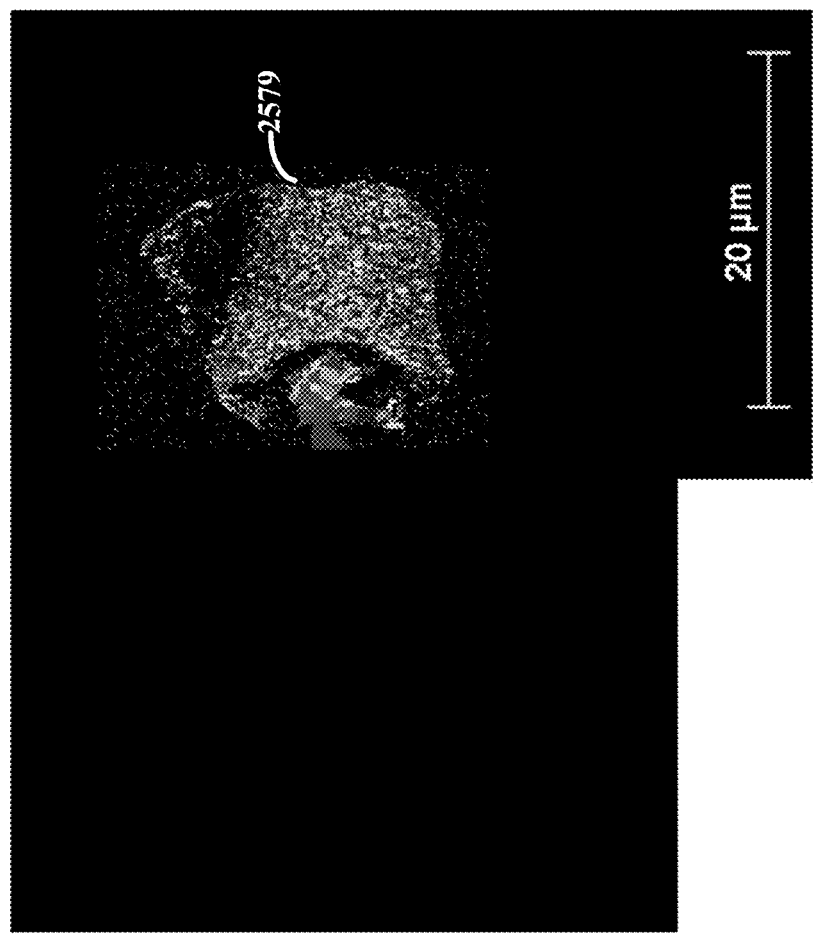

FIGS. 25A-25B illustrate an example of resulting single-crystalline metal grown on a substrate that has a roughened surface, in accordance with an experimental embodiment. Specifically, FIGS. 25A-25B show EBSD images of a seed 2579 (e.g., the diffused solid), consisting of gold-on-platinum, on a substrate with 10 nm RMS roughness. The crystal orientations of the metal grains in the seed are randomized as illustrated by the dotted pattern of FIG. 25B (with the black or grey background of FIGS. 25A-25B illustrating material other than the metal material and/or seed material). As such, the site in the seed 2579 for liquid metal epitaxy can be randomized, which leads to modification of the metal crystal orientation along the z-axis.

Terms to exemplify orientation and direction, such as upper/lower, left/right, top/bottom, up/down, above/below, vertical, horizontal, and perpendicular, may be used herein to refer to relative positions of elements as shown in the figures. Similarly, as heating and cooling are relative terms of art, it is appreciated that a heating source and a cooling source can be synonymous considering that the direction of temperature change can be controlled according to the desired temperature change. It should be understood that the terminology is used for notational convenience only and that in actual use the disclosed structures may be oriented different from the orientation shown in the figures. Thus, the terms should not be construed in a limiting manner.

Various embodiments are implemented in accordance with the underlying Provisional Application (Ser. No. 62/248,921), entitled "Single Metal Crystals", filed Oct. 30, 2015, and with an Appendix, to which benefit is claimed and which are fully incorporated herein by reference. For instance, embodiments herein and/or in the provisional application (including the appendices therein) may be combined in varying degrees (including wholly). Reference may also be made to the experimental teachings and underlying references provided in the underlying provisional application, including the Appendix that form part of the provisional application. Embodiments discussed in the Appendix are not intended, in any way, to be limiting to the overall technical disclosure, or to any part of the claimed invention unless specifically noted.

The Appendix of the underlying Provisional Application is hereby fully incorporated by reference for its general and specific teachings, including the figure showing a plasmonic array described in an article "Plasmonics for solid-state lighting: enhanced excitation and directional emission of highly efficient light sources" *Light: Science & Applications* (2013) 2, e66; doi:10.1038/1sa.2013.22. It is recognized that single-crystalline metal structures and methods of manufacture (including those discussed in the context of FIGS. 1-4) can be used in this and other contexts. This document is fully incorporated herein by reference for its teachings (including background references cited therein and which disclose applications beneficial to aspects of the present disclosure), generally and specifically, to the structures, processes, methods and uses described and shown therein.

Consistent with the Appendix, the single-crystalline metal structures and methods of manufacture can be used in a host of applications. For instance, single-crystalline metal structures and methods of manufacture can be used in combination with plasmon waveguides for on-chip optical interconnects, interferometry, and quantum computing, including but not limited to those discussed in Sergey I. Bozhevolnyi, et al., "Channel Plasmon-Polariton Guiding by Subwavelength Metal Grooves" Phys. Rev. Lett. 95, 046802; Oulton, Rupert F., et al. "A hybrid plasmonic waveguide for subwavelength confinement and long-range propagation." Nature Photonics 2.8 (2008): 496-500; Akimov, A. V., et al. "Generation of single optical plasmons in metallic nanowires coupled to quantum dots." Nature 450.7168 (2007): 402-406; and Bozhevolnyi, Sergey I., et al. "Channel plasmon subwavelength waveguide components including interferometers and ring resonators." Nature 440.7083 (2006): 508-511, each of which is fully incorporated herein by reference for all it contains.

In various embodiments, single-crystalline metal structures and methods of manufacture can be used in connection with nanoscale plasmonic lasers and LEDs, including but not limited to, those discussed in Gabriel Lozano et al., Plasmonics for solid-state lighting: enhanced excitation and directional emission of highly efficient light sources "Light: Science & Applications (2013) 2, e66; doi:10.1038/lsa.2013.22; Oulton, Rupert F., et al. "Plasmon lasers at deep subwavelength scale." Nature 461.7264 (2009): 629-632; and Lu, Yu-Jung, et al. "Plasmonic nanolaser using epitaxially grown silver film." Science 337.6093 (2012): 450-453, each of which is fully incorporated herein by reference for all it contains.

Embodiments of the present disclosure are directed toward single-crystalline metal structures and methods of manufacture that can be used in connection with plasmon-enhanced solar cells, including but not limited to those discussed in Ali Akbari, et al., "Surface plasmon waveguide Schottky detector," Opt. Express18, 8505-8514 (2010); and Abram L. Falk et al., "Near-field electrical detection of optical plasmons and single-plasmon sources" Nature Physics 5, 475-479 (2009), each of which is fully incorporated herein by reference for all it contains.

Various embodiments of the present disclosure are directed toward single-crystalline metal structures and methods of manufacture that can be used in connection with plasmonic-enhanced optical detectors, including but not limited to those discussed in Abram L. Falk et al., "Near-field electrical detection of optical plasmons and single-plasmon sources" Nature Physics 5, 475-479 (2009); and Falk, Abram L., et al. "Near-field electrical detection of optical plasmons and single-plasmon sources." Nature Physics 5.7 (2009): 475-479, each of which is fully incorporated herein by reference for all it contains.

A number of embodiments of the present disclosure are directed toward single-crystalline metal structures and methods of manufacture that can be used in connection with plasmonic metasurfaces for coloration, holograms, light coupling from free space onto chips, and ultra-thin lenses/optical components, including but not limited to those discussed in: Anders Pors et al. "Plasmonic metasurfaces for efficient phase control in reflection," Opt. Express 21, 27438-27451 (2013); Jeepe S. Clausen et al., "Plasmonic Metasurfaces for Coloration of Plastic Consumer Products" Nano Lett, 2014, 14(8), pp. 4499-4504; Liu, Zhaowei, et al. "Focusing surface plasmons with a plasmonic lens." Nano Letters 5.9 (2005): 1726-1729; Meinzer, Nina, et al., "Plasmonic meta-atoms and metasurfaces." Nature Photonics 8.12 (2014): 889-898; Chen, Weibin, et al. "Plasmonic lens made of multiple concentric metallic rings under radially polarized illumination." Nano letters 9.12 (2009): 4320-4325; Lin, Jiao, et al. "Polarization-controlled tunable directional coupling of surface plasmon polaritons." Science 340.6130 (2013): 331-334; and Yu, Nanfang, et al. "Light propagation with phase discontinuities: generalized laws of reflection and refraction." science 334.6054 (2011): 333-337, each of which is fully incorporated herein by reference for all it contains.

Various embodiments of the present disclosure are directed toward single-crystalline metal structures and methods of manufacture that can be used in connection with plasmonics for photocatalysis, including but not limited to those discussed in Mukherjee, Shaunak et al. "Hot electrons do the impossible: plasmon-induced dissociation of H2 on Au." Nano letters 13.1 (2012): 240-247; Christopher, Phillip, Hongliang Xin, and Suljo Linic. "Visible-light-enhanced catalytic oxidation reactions on plasmonic silver nanostructures." Nature chemistry 3.6 (2011): 467-472; and Marimuthu, Andiappan, et al., "Tuning selectivity in propylene epoxidation by plasmon mediated photo-switching of Cu oxidation state." Science 339.6127 (2013): 1590-1593, each of which is fully incorporated herein by reference for all it contains.

Various blocks, modules or other circuits may be implemented to carry out one or more of the operations and activities described herein and/or shown in the figures. For example, processes such as heating, etching, and deposition can be automated through the use of various circuits and associated machines. In these contexts, various depicted functions can be implemented using a circuit that carries out one or more of these or related operations/activities. In various embodiments, a hard-wired control block can be used to minimize the area for such an implementation in case a limited flexibility is sufficient. Alternatively and/or in addition, in certain of the above-discussed embodiments, one or more modules are discreet logic circuits or programmable logic circuits configured and arranged for implementing these operations/activities.

Based upon the above discussion and illustrations, those skilled in the art will readily recognize that various modifications and changes may be made to the various embodiments without strictly following the exemplary embodiments and applications illustrated and described herein. For example, an apparatus can include different types of metals and different substrates and insulating materials and configurations than illustrated by the Figures. Such modifications do not depart from the true spirit and scope of various aspects of the disclosure, including aspects set forth in the claims.

What is claimed is:

1. A method for creating a single-crystalline metal on a substrate, the method comprising:
depositing a metal material and a seed material on a surface of a substrate;
encapsulating the metal material and seed material within an insulating material to form a crucible, wherein the seed material is located at an end of crucible;
liquefying the metal material contained within the crucible; and
cooling the metal material by causing a temperature gradient effected in the substrate in a direction that is neutral along the surface of the substrate and, therein, growing the single-crystalline metal in the crucible based on an orientation of the seed material, the above steps facilitating independence, by lack of correlation, of a defined orientation of the single-crystalline metal on latching lattice matching of the metal material with the substrate.

2. The method of claim 1, wherein the growing the single-crystalline metal in the crucible further includes seeding the single-crystalline metal from a seed material located at an end of the crucible.

3. The method of claim 2, further comprising directing a crystalline orientation of the single-crystalline metal to align with a physical orientation of the crucible.

4. The method of claim 1, wherein depositing the seed material includes depositing an amorphous or poly-crystalline material that does not include a taper and the single-crystalline metal aligns with a physical orientation of the crucible.

5. The method of claim 1, wherein the temperature gradient is effected by heating and cooling through application of uniform temperatures across the surface of the substrate.

6. The method of claim 1, wherein liquefying the metal material contained within the crucible includes heating the substrate to a temperature that is at or above a melting point of the metal material and below a melting point of the seed material, resulting in formation a diffused solid formed by a portion of the metal material and the seed material, the diffused solid having a higher melting point than the metal material and which forms a metal-insulator interface from which crystal growth propagates.

7. The method of claim 1, wherein the seed material is a metal that is a different type of metal and has a different melting point than the metal material contained within the crucible.

8. The method of claim 1, wherein depositing the metal and the seed material on the substrate further includes sequentially patterning the seed material and the metal, wherein the seed material and the metal include different melting points.

9. The method of claim 1, wherein liquefying the metal material contained within the crucible further includes forming a solid from the metal material and the seed material, wherein the solid exhibits a higher melting point than the metal material.

10. The method of claim 1, wherein the single-crystalline metal is configured with an orientation in a z direction.

11. The method of claim 1, wherein the single-crystalline metal is a noble metal and a portion of the substrate is in contact with the single-crystalline metal.

12. The method of claim 11, wherein the portion of the substrate is an insulator made from oxide of a semiconductor material, and the metal material contained within the crucible is in contact with the portion of the substrate while liquefying the metal material.

13. The method of claim 1, wherein liquefying the metal material contained within the crucible further includes diffusing the metal material with the seed material to form a diffused solid in response to heating the substrate, crucible, seed material, and metal material to a temperature below a melting point of the metal material, and wherein the single-crystalline metal growth propagates from the diffused solid in response to the cooling.

14. The method of claim 1, wherein depositing the seed material includes depositing an amorphous material that does not include a taper.

15. A method for creating a single-crystalline metal on a substrate, the method comprising:
 liquefying a metal material contained within a crucible while in contact with a surface of the substrate; and
 cooling the metal material by causing a temperature gradient effected in the substrate in a direction that is neutral along the surface of the substrate and, therein, growing the single-crystalline metal in the crucible; and
 roughing the surface of the substrate prior to the metal material being in contact with the surface of the substrate, wherein the single-crystalline metal is configured with an orientation in a z direction.

* * * * *